US012811582B2

(12) United States Patent
Sankaranarayanan et al.

(10) Patent No.: US 12,811,582 B2
(45) Date of Patent: Nov. 24, 2026

(54) METHODS AND APPARATUS TO MONITOR AN INPUT VOLTAGE

(71) Applicant: Texas Instruments Incorporated, Dallas, TX (US)

(72) Inventors: Sowmya Sankaranarayanan, Tucson, AZ (US); Kang Wei, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/587,497

(22) Filed: Feb. 26, 2024

(65) Prior Publication Data

US 2025/0125799 A1 Apr. 17, 2025

Related U.S. Application Data

(60) Provisional application No. 63/589,772, filed on Oct. 12, 2023.

(51) Int. Cl.

*H03K 17/22* (2006.01)
*G01R 15/04* (2006.01)
*G01R 19/165* (2006.01)

(52) U.S. Cl.

CPC ........... *H03K 17/223* (2013.01); *G01R 15/04* (2013.01); *G01R 19/16519* (2013.01); *H03K 2217/0027* (2013.01)

(58) Field of Classification Search

None

See application file for complete search history.

(56) References Cited

U.S. PATENT DOCUMENTS 8,823,418 B2 * 9/2014 Chang ................ G01R 19/0084 327/143
10,972,092 B2 * 4/2021 Khurana .................. G06F 1/24

OTHER PUBLICATIONS

Smith, "Understanding Undervoltage Lockout in Power Devices," Texas Instruments, Apr. 2016, 6 pages.
"Low Power 250-nA IQ and Small Size Supply Voltage Supervisors," Texas Instruments, Aug. 2018, 48 pages.
"Nano Power, High Input Voltage Supervisor With MR and Programmable Delay," Texas Instruments, Dec. 2018, 44 pages.
"Low-VIN (0.7 V), Low-Noise (2.1 µVRMS), High-Accuracy (1%), Ultra-Low Dropout (LDO) Voltage Regulator," Texas Instruments, Jul. 2022, 88 pages.

* cited by examiner

*Primary Examiner* — Jeffrey S Zweizig
(74) *Attorney, Agent, or Firm* — Charles F. Koch

(57) ABSTRACT

An example apparatus includes: first circuitry configured to verify a set of reference voltages is stable; and second circuitry including a first transistor, a second transistor, a first number of parallel transistors, and a second number of parallel transistors, the second circuitry configured to, in response to the verification: produce a trip voltage based on: a comparison of a threshold voltage of the first transistor and a threshold voltage of the second transistor; and a reference voltage selected from the set and provided to a control terminal of the first transistor; and adjust the value of the trip voltage based on a comparison between a first current mirror having a first number of parallel transistors and a second current mirror connected to a second number of parallel transistors.

19 Claims, 12 Drawing Sheets

METHODS AND APPARATUS TO MONITOR AN INPUT VOLTAGE

CROSS-REFERENCE TO RELATED APPLICATION

This patent application claims the benefit of and priority to U.S. Provisional Patent Application No. 63/589,772 filed Oct. 12, 2023, which application is hereby incorporated herein by reference in its entirety.

TECHNICAL FIELD

This description relates generally to power-on reset (POR) circuits and, more particularly, to methods and apparatus to monitor an input voltage.

BACKGROUND

Electronic devices generally include power management circuitry and load circuitry. The power management circuitry may control a voltage and/or current provided to the load circuitry, which then consumes power to provide a function. The functionality of the load circuitry can vary widely based on the type of electronic device. Accordingly, different load circuits may require different amounts of power and/or have different timing requirements to support such functionality.

SUMMARY

For methods and apparatus to monitor an input voltage, an example apparatus includes first circuitry configured to verify a set of reference voltages is stable; and second circuitry including a first transistor, a second transistor, a first number of parallel transistors, and a second number of parallel transistors, the second circuitry configured to, in response to the verification: produce a trip voltage based on: a combination of a threshold voltage of the first transistor and a threshold voltage of the second transistor; and a reference voltage selected from the set and provided to a control terminal of the first transistor; and adjust the value of the trip voltage based on a comparison between a first current mirror having a first number of parallel transistors and a second current mirror connected to a second number of parallel transistors.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
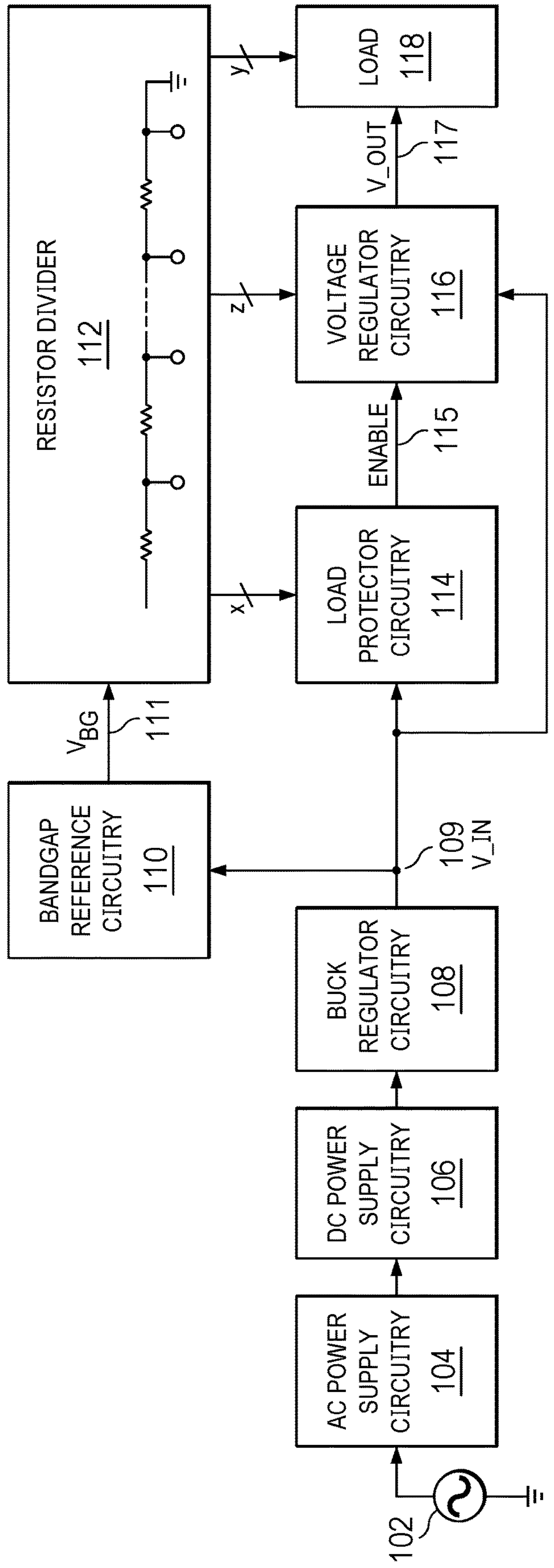
FIG. 1 is a block diagram of an example environment including voltage protector circuitry.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

Some types of load circuits may require an operational voltage that is not immediately available when an electronic device is powered on. In such examples, the electronic device generates the required voltage after being powered on for an amount of time. However, if load circuitry attempts to perform operations before the required voltage is available, the load circuitry may produce an incorrect output, damage one or more components of the electronic device and/or, more generally, cause unexpected behavior. For example, a processor that is rated to receive x volts at a power supply terminal may perform unreliably when the voltage at the power supply terminal is below x volts.

In general, power-on reset (POR) circuits connect to an electronic device in between load circuitry and power supply circuitry. POR circuitry protects load circuitry by ensuring the load circuitry does not inadvertently attempt to perform operations before the required voltage is available. As used above and herein, the required voltage at which load circuitry can safely perform operations may be referred to as a trip voltage (V_TRIP). To protect a load, an electronic device generates an input voltage (V_IN) and provides V_IN to POR circuitry rather than directly to the load. When V_IN is less than V_TRIP, the load cannot use V_IN to perform operations safely. Accordingly, the POR circuitry outputs zero volts (0 V) when V_IN<V_TRIP so that a connected load lacks any power to attempt operations. Once the electronic device has been powered-on long enough, V_IN rises above the V_TRIP threshold and is now safe for usage by the load. Accordingly, the POR circuitry allows V_IN to be passed onto the load once V_IN≥V_TRIP. Furthermore, POR circuits also protect load circuits after the electronic device powers on from any errors that may cause the value of V_IN to fall back below V_TRIP.

POR circuits traditionally rely on bandgap reference (BGR) circuitry to generate a signal when comparing two voltages that are proportional to V_IN and V_TRIP. Such a comparison by the POR circuitry determines whether V_IN is above, below, or approximately equal to V_TRIP, and therefore enables the POR circuitry to protect the load properly. While BGR circuits generally produce signals with stable voltages, the output of BGR circuits can still vary when the electronic device is powering on. Therefore, POR circuits that rely on BGR circuitry also need a circuit to determine if the BGR output is stable enough for comparison (e.g., to determine whether the BGR output is ready to use), and this circuit is referred to as BG_OK circuitry. Traditionally, a significant portion of the area on an integrated circuit (IC) dedicated to implementing such POR circuitry is used to implement the BG_OK circuitry. As a result, reliance on BG_OK circuitry traditionally increases the cost and size of POR circuitry.

Conventional POR circuits also include a resistor divider to produce the voltage that is proportional to V_IN and used in comparison operations. The use of a resistor divider introduces a design trade-off between quiescent current and size of the POR circuit. Quiescent current is the current consumed by an IC when the IC is enabled but not supporting the load, or when the IC is in a non-switching condition. Accordingly, industry members seek to design low quiescent current ICs to reduce power consumption. Decreasing the quiescent current of a resistor divider requires the use of larger resistors within the resistor divider (thereby increasing cost and/or size of the POR circuit) and/or using additional masks to fabricate (thereby increasing the cost and/or complexity of the POR circuit).

Some POR circuits avoid using BG_OK circuitry by waiting to perform comparison operations until the output of the BGR circuitry is presumed to be stable. However, the time required for the output of a BGR circuitry to become stable will vary between power cycles due to environmental conditions. To prevent damage to the load, such POR circuits protect against worst-case scenarios by waiting a relatively long amount of time to perform comparison operations (thereby increasing the probability that the BGR output is stable). As a result, POR circuits that wait for the BGR output are slow to determine that V_IN>V_TRIP, slow to pass V_IN onto the load, may fail to meet timing requirements of some load circuits, and generally exhibit poorer performance (when compared to POR circuits that use a BG_OK circuit). Furthermore, such POR circuits are still limited by a quiescent current/size trade-off due to the inclusion of a resistor divider.

Other POR circuits avoid the use of BGR circuitry and instead generate a V_TRIP signal by combining two different intrinsic voltage thresholds of two field effect transistors (FETs). For example, by operating a standard voltage threshold (SVT) field effect transistor and a native (NAT) field effect transistor in a sub-threshold region, POR circuitry can generate a V_TRIP signal that is based on the difference between the threshold voltage of the SVT FET and the NAT FET. However, threshold voltages of FETs can vary due to environmental conditions and are generally less stable than bandgap references. Therefore, POR circuits that combine intrinsic voltage thresholds can generate a V_TRIP signal that varies over time and is relatively inaccurate. Furthermore, the magnitude of a V_TRIP signal generated only by combining intrinsic threshold voltages would be relatively small compared to the magnitude of voltage at which load circuits can safely perform operations. Such POR circuits increase the voltage of V_TRIP by including a resistor divider and therefore suffer the tradeoff between quiescent current and size.

Some POR circuits use intrinsic voltage thresholds to generate V_TRIP without including a resistor divider to augment the value of V_TRIP. To do so, V_IN is itself used in comparison instead of a value proportional to V_IN that is generated by a resistor divider. However, generating a voltage that can be compared directly to V_IN requires the POR circuitry include low voltage threshold (LVT) FETs in addition to the SVT and NAT FETs described above. LVT FETs require additional masking and more space to construct than other SVT and NAT FETs, thereby adding both complexity and size to such POR circuits. Furthermore, such POR circuits are generally less accurate than POR circuits that rely on BGR circuits because they combine intrinsic voltage thresholds of FETs.

Example methods, systems, and apparatus described herein support POR circuitry that is comparatively small, has low quiescent current and cost effective compared to other POR circuits. The example POR circuitry generates a V_TRIP signal based on both a combination of intrinsic threshold voltages and reference voltages. The example POR circuitry includes example BG_OK circuitry to verify the bandgap reference output is stable enough for comparison. The example BG_OK circuitry described herein is simpler and smaller than other BG_OK circuits because it only enables or disables the rest of the POR circuitry, and because the rest of the POR circuitry generates the V_TRIP in a manner that is not dependent in time on a BGR output. Accordingly, the example BG_OK circuitry can be less accurate (and therefore smaller) than other BG_OK circuits without negatively impacting the accuracy of the example POR circuitry.

Notably, the reference voltages used by the example POR circuitry are produced by a system-level resistor divider (e.g., on the bandgap reference output) that is used by other components of an electronic device and not specific to the POR circuitry. Accordingly, a designer or manufacturer of the POR circuitry does not have precise control over the voltage that is provided by the resistor divider and contributed to V_TRIP. However, the example POR circuitry can enable or disable a subset of parallel transistors connected to current mirrors within the POR circuitry to make small adjustments to the value of V_TRIP. Such adjustments enable the POR circuitry to precisely control the value of V_TRIP (and therefore the value at which the load turns on) without the use of a local resistor divider, thereby breaking the trade-off between quiescent current and size. Accordingly, the example POR circuitry described herein has low quiescent current and cost of implementation while being smaller than other devices.

FIG. 1 is an example block diagram of an electronic device. FIG. 1 includes an example power source 102, an example Alternating Current (AC) power supply circuitry 104, an example Direct Current (DC) power supply circuitry 106, example buck regulator circuitry 108, example bandgap reference (BGR) circuitry 110, an example resistor divider 112, example load protector circuitry 114, example voltage regulator circuitry 116, and an example load 118. FIG. 1 also includes an input voltage 109 (which may be referred to herein as V_IN 109), an example enable signal 115, and an example output voltage 117 (which may be referred to herein as V_OUT 117).

The example power source 102 provides AC power to the example environment of FIG. 1. The example power source 102 may be implemented by any device providing electrical energy in AC. For example, in FIG. 1, the example power source 102 is implemented by a 120 Volts (V) AC outlet.

The example AC power supply circuitry 104 transforms the 120 VAC into a different AC signal that is operable upon by the DC power supply circuitry 106. In particular, the example AC power supply circuitry 104 may alter one or more of the voltages, frequency, shape of signal, number of phases, etc., depending on the type of the power source 102 and the requirements of the DC power supply circuitry 106.

The example DC power supply circuitry 106 transforms the AC signal received from the AC power supply circuitry 104 into a DC signal. The example DC power supply circuitry 106 includes rectifier circuitry and filter circuitry to convert the AC signal to a DC signal. The example DC power supply circuitry 106 is configured to provide a DC signal at a voltage that is operable by the example buck regulator circuitry 108. In some examples, the DC power supply circuitry 106 is referred to as a voltage source.

The example buck regulator circuitry 108 is a voltage regulator that transforms the first DC voltage provided by the example DC power supply circuitry 106 into a second DC voltage. Once the second DC voltage rises above a threshold voltage V_TRIP, the second DC voltage can be used by the load 118 to safely perform operations. In examples described herein, the voltage provided by the buck regulator circuitry 108 is referred to as an input voltage 109 (V_IN 109) because it is received by the load protector circuitry 114.

V_IN 109 is also received by the bandgap reference circuitry 110, which uses the input to produce a reference voltage referred to herein as the V_BG 111. The BGR circuitry 110 produces an output such that the value of V_BG 111 is generally stable (e.g., experiences little to no variations in value due to temperature changes, changes to V_IN 109, or changes to the power provided to the load 118). However, when the electronic device of FIG. 1 is first powered on, the BGR circuitry 110 requires an amount of time to pass before the value of V_BG 111 becomes stable.

The resistor divider 112 includes a number of resistors coupled to one another in series, with a first resistor in the resistor divider 112 configured to receive V_BG 111 and a last resistor in the resistor divider 112 configured to be coupled to ground. As such, the resistor divider 112 produces a number of reference voltages that are smaller than V_BG 111, where the quantity and magnitude of the reference voltages are determined by the quantity and values of the resistors.

The resistor divider 112 is a system level component because the reference voltages it produces are used by a number of components throughout the electronic device. For example, in FIG. 1, the load protector circuitry 114 receives x reference voltages from the resistor divider 112, the voltage regulator circuitry 116 uses z reference voltages, and the load 118 uses y reference voltages. As used above, x, y, and z are limited by the quantity of resistors in the resistor divider 112 but, in general, may be any positive integer. In some examples, the resistor divider 112 produces voltages that are used by components throughout the electronic device other than those shown in FIG. 1.

The load protector circuitry 114 protects the load 118 from unsafe voltages in the teachings described herein. To do so, the load protector circuitry 114 receives the V_IN 109 from the buck regulator circuitry 108 and x reference voltages from the resistor divider 112. The load protector circuitry 114 uses the foregoing signals to produce the enable signal 115, which indicates whether the value of V_IN 109 is safe for the load 118 to use. Advantageously, the load protector circuitry 114 uses the enable signal 115 while omitting use of other signals to indicate V_IN 109 is safe for usage when value of V_IN 109 is above V_TRIP. The load protector circuitry 114 is discussed further in connection with FIG. 2.

The voltage regulator circuitry 116 uses the enable signal 115 to determine the what output voltage 117 (V_OUT 117) should be provided to the load 118. For example, the voltage regulator circuitry 116 provides the input voltage to the load 118 (e.g., sets V_OUT 117 equal to V_IN 109) when the enable signal 115 indicates it is safe to do so. The voltage regulator circuitry 116 also blocks the input voltage from reaching the load 118 (e.g., sets V_OUT 117 to zero volts) when the enable signal 115 indicates that V_IN 109 is not safe for usage.

In the example of FIG. 1, the voltage regulator circuitry 116 also uses z reference voltages from the resistor divider 112 to perform operations. In some examples, the voltage regulator circuitry 116 is a low-dropout (LDO) regulator as discussed further in connection with FIG. 11. In other examples, the voltage regulator circuitry 116 is implemented using a different architecture.

In FIG. 1, the example load 118 refers to any device capable of using the power from V_OUT 117 to perform operations. In some examples, the load 118 may require specific amounts of power at specific times to perform various operations. Such requirements may generally be referred to as performance requirements of the load 118. In the example of FIG. 1, the load 118 also uses reference voltages from the resistor divider 112 to perform operations.

Advantageously, the load protector circuitry 114 produces the enable signal 115 through the use of an external component (the resistor divider 112). Because the resistor divider 112 was already needed within the electronic device to support other operations (e.g., to provide reference voltages to the voltage regulator circuitry 116, the load 118, and/or other components), the area of an integrated circuit dedicated exclusively to implementing the load protector circuitry 114 does not include a resistor divider and is comparatively small. In contrast, other electronic devices may include a system-level resistor divider (to support the load and/or other components), and POR circuitry including a local resistor divider dedicated exclusively to the POR operations. This second resistor divider that is local to the POR circuitry increases the cost of implementation and makes the area of an integrated circuit dedicated exclusively to implementing such POR circuitry comparatively large.

In the example of FIG. 1, the output of the DC power supply circuitry 106 is at a high voltage that may damage the load protector circuitry 114 if used directly. Accordingly, the buck regulator circuitry 108 decreases the DC power supply voltage before the load protector circuitry 114 is used in the power delivery chain, thereby ensuring that value of V_IN 109 is operable by the load protector circuitry 114. V_IN 109 is then provided to the load 118 by the voltage regulator circuitry 116, which is a separate device from the buck regulator circuitry 108 in FIG. 1.

In other examples, the output of the DC power supply circuitry 106 is at a sufficiently low voltage such that it is operable by the load protector circuitry 114. In such examples, a power delivery chain may include a single voltage regulator device. Said power delivery chain may further include the DC power supply circuitry 106 connected directly to the load protector circuitry 114 and the load protector circuitry 114 connected to the voltage regulator device. In such other examples, the voltage regulator device both: a) decreases the magnitude of the input voltage and b) provides the stepped-down input voltage to the load 118 when the enable signal 115 indicates it is safe to do so.

Figure 2:
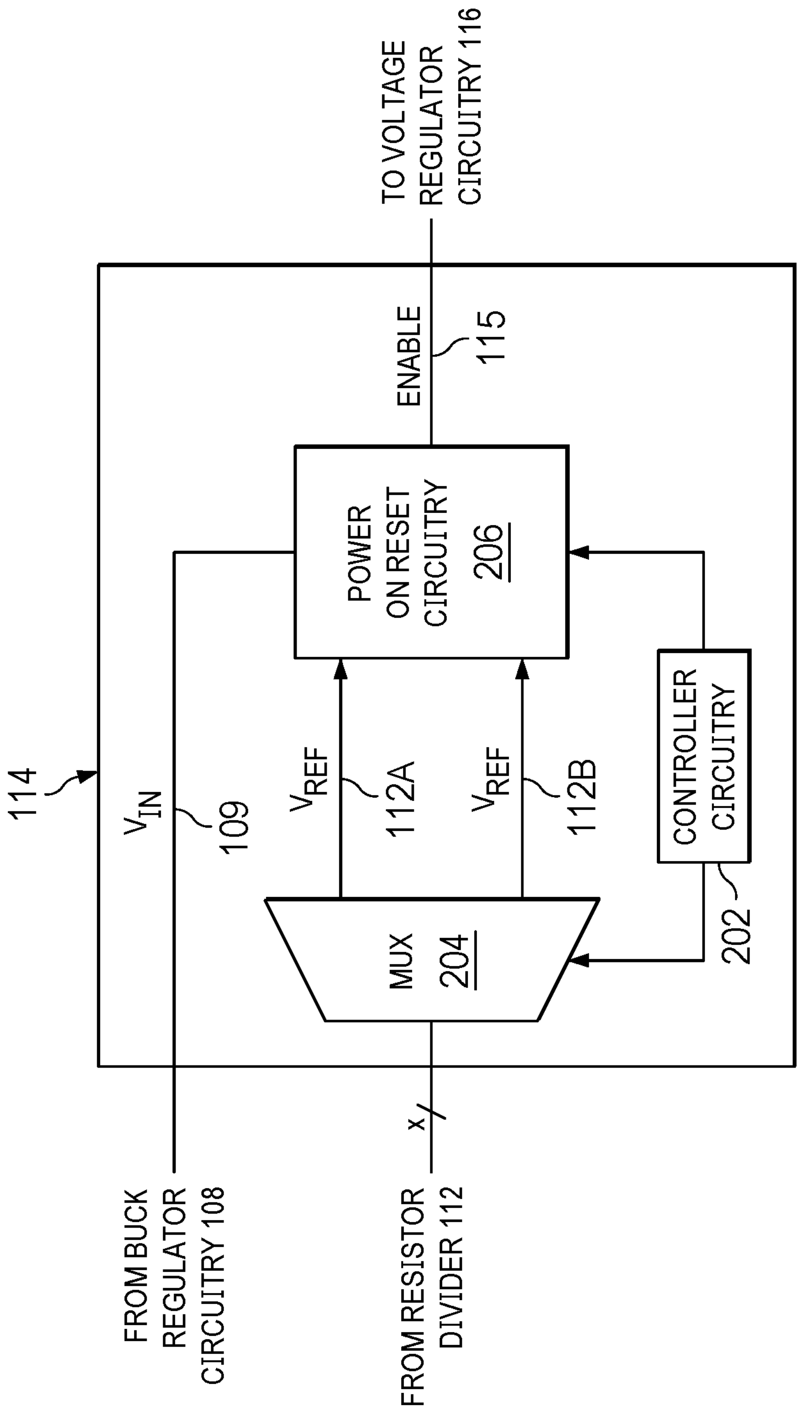
FIG. 2 is a block diagram of an example implementation of the load protector circuitry of FIG. 1.

FIG. 2 is a block diagram of an example implementation of the load protector circuitry of FIG. 1. The load protector circuitry 114 of FIG. 2 may be instantiated (e.g., creating an instance of, bring into being for any length of time, materialize, implement, etc.) by programmable circuitry such as a Central Processor Unit (CPU) executing first instructions. The load protector circuitry 114 of FIG. 2 may be instantiated (e.g., creating an instance of, bring into being for any length of time, materialize, implement, etc.) by (i) an Application Specific Integrated Circuit (ASIC) and/or (ii) a Field Programmable Gate Array (FPGA) structured and/or configured in response to execution of second instructions to perform operations corresponding to the first instructions. Some or all of the circuitry of FIG. 2 may, thus, be instantiated at the same or different times. Some or all of the circuitry of FIG. 2 may be instantiated, for example, in one or more threads executing concurrently on hardware and/or in series on hardware. Moreover, in some examples, some or all of the circuitry of FIG. 2 may be implemented by microprocessor circuitry executing instructions and/or FPGA circuitry performing operations to implement one or more virtual machines and/or containers. In the example of FIG. 2, the load protector circuitry 114 includes V_IN 109 and the enable signal 115 of FIG. 1. The load protector circuitry 114 also includes example controller circuitry 202, an example multiplexer 204 (which may be herein referred to as mux 204), and example power-on reset (POR) circuitry 206.

The example controller circuitry 202 provides configuration signals that collectively determine the magnitude of a threshold voltage (referred to above and herein as V_TRIP) used by the POR circuitry 206. For example, the controller circuitry 202 provides a select signal to the multiplexer, which has x input terminals configured to receive reference voltages from the resistor divider and two output terminals connected to the POR circuitry 206. The controller circuitry 202 determines which two reference voltages (of the x available) will be used by the POR circuitry 206 to perform operations. Notably, the controller circuitry 202 is unable to select the quantity or magnitude of the x available reference voltages. The controller circuitry 202 also provides additional configuration signals used directly by the POR circuitry 206, which are discussed further in connection with FIG. 3. As used herein, the two reference voltages selected by the controller circuitry 202 and output by the mux 204 may be referred to as V_REF 112A and V_REF 112B. The values of V_REF 112A and V_REF 112B, and the other configuration signals provided by the controller circuitry 202, influence the value of V_TRIP.

The example controller circuitry 202 may be implemented by any type of programmable circuitry. Examples of programmable circuitry include but are not limited to programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). In some examples, the controller circuitry 202 is instantiated by programmable circuitry executing controller instructions and/or configured to perform operations such as those represented by the flowchart(s) of FIGS. 9 and 10.

In the example of FIG. 2, the load protector circuitry 114 is implemented in an environment where the value of V_TRIP may change over time. The value of V_TRIP may change for any reason, including but not limited to a change in the functionality of the load 118, connecting additional load circuitry to receive V_OUT 117, replacing the load 118 with a different load circuit, and/or more generally, a change in any conditions of the electronic device of FIG. 1 that may alter the power requirements of a connected load circuit(s). Accordingly, the example of FIG. 2 includes the controller circuitry 202 to programmatically adjust the value of V_TRIP based on current environmental conditions.

In other examples, the load protector circuitry 114 is implemented in an application where the value of V_TRIP does not change. In such examples, the load protector circuitry 114 may be hardcoded to receive specific configuration signals necessary to generate a singular V_TRIP value. In such examples, the example POR circuitry 206 may receive V_REF 112A and 112B through a direct connection to the resistor divider 112 rather than through an intermediate connection of the mux 204 as shown in FIG. 2. Such a direct connection may remove the ability for the value of V_TRIP to change, but also remove the need to include the controller circuitry 202 or mux 204 (thereby reducing cost and/or area of the IC area dedicated to the load protector circuitry 114).

In the example of FIG. 2, the example POR circuitry 206 receives the V_IN 109 from the buck regulator circuitry 108 and V_REF 112A and 112B from the mux 204. The POR circuitry 206 then produces the enable signal 115, in accordance with the teachings described herein. The enable signal 115 is used by voltage regulator circuitry 116 to produce V_OUT 117 as discussed above such that: a) V_OUT 117 matches the value of V_IN 109 when the value of V_IN 109 is greater than or equal to V_TRIP, and b) V_OUT 117 is approximately 0 V when V_IN 109 is less than V_TRIP. The POR circuitry 206 and V_TRIP are discussed further in connection with FIG. 3.

Figure 3:
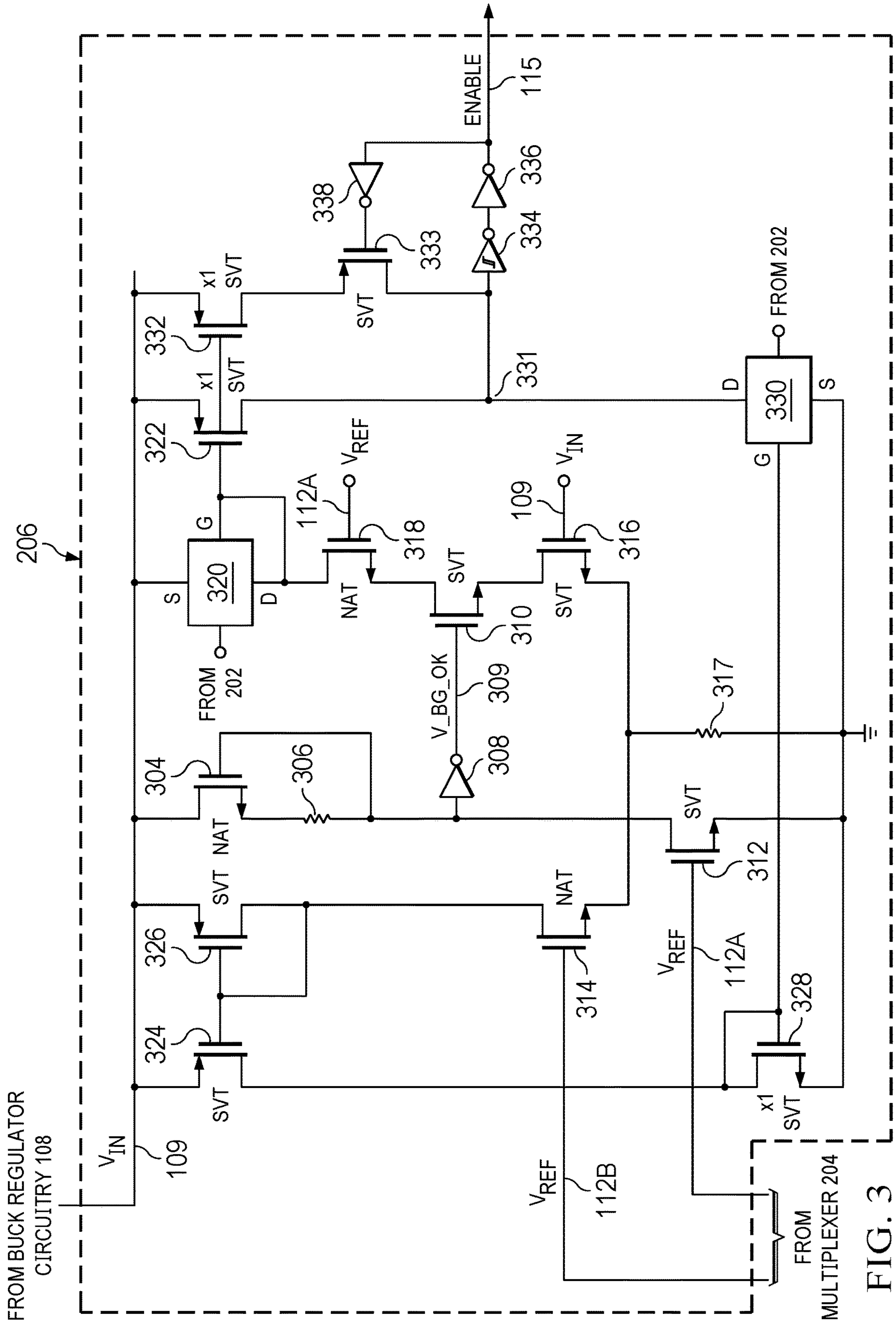
FIG. 3 is a block diagram of an example implementation of the power-on reset (POR) circuitry of FIG. 2.

FIG. 3 is a block diagram of an example implementation of the power-on-reset (POR) circuitry of FIG. 2. FIG. 3 includes example NMOSs 304, 310, 312, 314, 316, and 318, example NMOS connector circuitry 330, example PMOSs 322, 324, 326, 332, and 333, example PMOS connector circuitry 320, example resistors 306 and 317, example inverters 308, 336, and 338, and example hysteresis circuitry 334. FIG. 3 also includes an example bandgap OK voltage 309 (V_BG_OK 309) and an example comparison terminal 331.

In the example of FIG. 3, the NMOS 304 includes a drain configured to receive V_IN 109, a gate, and a source coupled to the control terminal of NMOS 304. The resistor 306 includes a first terminal coupled to the source of NMOS 304 and a second terminal coupled to the gate of NMOS 304. The inverter 308 includes an input terminal connected to the second terminal of the resistor 306 and an output terminal. As used above and herein, the voltage at the output terminal is referred to as V_BG_OK 309. The NMOS 310 includes a drain, a gate coupled to the output terminal of the inverter 308, and a source. The NMOS 312 includes a source coupled to the input terminal of the inverter 308, a gate configured to receive V_REF 112A from the mux 204, and a source configured to be coupled to ground.

In the example of FIG. 3, the NMOS 312 includes a drain, a gate configured to receive V_REF 112B from the mux 204, and a source. The NMOS 316 is an SVT transistor that includes a drain coupled to the source of NMOS 310, a gate configured to receive V_IN 109, and a source coupled to the source of NMOS 314. The NMOS 314 is a NAT transistor. The resistor 317 includes a first terminal coupled to the sources of NMOSs 314 and 316, and a second terminal configured to be coupled to ground. The NMOS 318 includes a drain, a gate configured to receive V_REF 112A from the mux 204, and a source coupled to the drain of NMOS 310.

The PMOS connector circuitry 320 refers to a configurable number, A, of PMOS transistors that are connected to one another in parallel. The transistors within the PMOS connector circuitry 320 have sources configured to receive V_IN 109, gates, and drains that are coupled to both: a) the gates of PMOS connector circuitry 320 and b) the drain of NMOS 318. The PMOS connector circuitry 320 also receives configuration signals from the controller circuitry 202. The PMOS connector circuitry 320 is discussed further in connection with FIG. 4. The PMOS 322 includes a source configured to receive V_IN 109, a gate coupled to the gates of PMOS connector circuitry 320, and a drain.

The PMOS 324 includes a source configured to receive V_IN 109, a gate, and a drain. The PMOS 326 includes a source configured to receive V_IN 109, a gate coupled to the gate of PMOS 324, and drain coupled to both: a) the gates of PMOSs 324 and 326, and b) the drain of NMOS 314. The NMOS 328 includes a drain coupled to the drain of PMOS 324, a gate coupled to the source of NMOS 328, and a source configured to be connected to ground.

The NMOS connector circuitry 330 refers to a configurable number, B, of NMOS transistors that are connected to one another in parallel. The transistors within the NMOS connector circuitry 330 have drains coupled to the drain of PMOS 322, gates coupled to the gate of NMOS 328, and sources configured to be coupled to ground. The NMOS connector circuitry 330 also receives configuration signals from the controller circuitry 202. The NMOS connector circuitry 330 is discussed further in connection with FIG. 4. The terminal where the drains of PMOS 322 and NMOS connector circuitry 330 meet is referred to above and herein as the comparison terminal 331.

The PMOS 333 includes a source coupled to the drain of PMOS 332, a gate, and a drain coupled to the comparison terminal 331. The hysteresis circuitry 334 includes an input terminal coupled to the comparison terminal 331 and an output terminal. The inverter 336 includes an input terminal coupled to the output terminal of the hysteresis circuitry 334 and an output terminal. The voltage at the output terminal of the inverter 336 is referred to above and herein as the enable signal 115. The inverter 338 includes an input terminal configured to receive the enable signal 115 and an output terminal coupled to the gate of PMOS 333.

In the example of FIG. 3, the transistors 304, 310, 314, 316, 318, and 328 are n-channel metal-oxide semiconductor field-effect transistors (MOSFETs). Alternatively, one or more of the transistors 304, 310, 314, 316, 318, and 328 may be an n-channel field-effect transistor (FET), an n-channel insulated-gate bipolar transistor (IGBT), an n-channel junction field effect transistors (JFET), an NPN bipolar junction transistor (BJT) and/or, with slight modifications, a p-type equivalent device.

Similarly, In the example of FIG. 3, the transistors 322, 324, 326, 332, and 333 are p-channel MOSFETs. Alternatively, the transistors 322, 324, 326, 332, and 333 may be p-channel FETs, p-channel IGBTs, p-channel JFETs, NPN BJTs, and/or, with slight modifications, N-type equivalent devices. The transistors 322, 324, 326, 332, and 333 may be depletion mode devices, drain-extended devices, enhancement mode devices, natural transistors or other types of device structure transistors. Furthermore, the transistors described herein may be implemented in/over a silicon substrate (Si), a silicon carbide substrate (SiC), a gallium nitride substrate (GaN) or a gallium arsenide substrate (GaAs).

In the example of FIG. 3, the NMOS 304, resistor 306, inverter 308, NMOS 310, and NMOS 312 collectively function as BG_OK circuitry that verifies the value of V_REF 112A is sufficiently stable. The value of V_REF 112A being sufficiently stable means that the resistor divider 112 is producing stable reference voltages because its input, V_BG 111, is now stable. Accordingly, V_REF 112B is also stable once V_REF 112A is determined to be stable.

To determine that V_REF 112A is stable, the NMOS 304 and resistor 306 operate as a current source that powers NMOS 312 on. When the value of V_REF 112A exceeds the intrinsic threshold voltage of NMOS 312, both the input voltage of inverter 308 and V_BG_OK 309 change values such that NMOS 310 turns on and an electrical connection is established between NMOSs 316 and 318. The connection between NMOS 316 and 318 enables the POR circuitry 206 to produce a nonzero value of the enable signal 115 as discussed further below. Alternatively, when V_REF 112A is still less than the intrinsic threshold voltage of NMOS 312, then N_MOS 310 remains off and the enable signal 115 remains at 0 V.

The electrical connection between NMOS 316 and 318 enables the intrinsic threshold voltage of NMOS 314, a NAT, and the intrinsic threshold voltage of NMOS 316, an SVT, to contribute to the value of V_TRIP. As used herein, the combination of the intrinsic threshold voltages of NMOS 314 and 316 is referred to as ΔV_TH. Generally, the structure of SVTs and NATs leads to the value of ΔV_TH being approximately between 800-900 milli-Volts (mV). However, many applications require the value of V_IN 109 to be around approximately 1.2-1.3 V before it is considered usable by the load 118 so that transistors within the load 118 can safely power on.

To check that V_IN 109 has reached approximately 1.2-1.3 V, other POR circuits that use SVTs and NATs include a local resistor divider to proportionally decrease the value of V_IN 109. The reduced voltage can then be compared directly to the value of ΔV_TH (e.g., approximately between 800 and 900 mV) such that, when the reduced voltage is greater than ΔV_TH, V_IN 109 has reached V_TRIP and can be considered safe for use. However, POR circuits with a local resistor divider suffer a trade-off between quiescent current and size as discussed above.

Rather than using a local resistor divider to decrease the value of V_IN 109, the example POR circuitry 206 increases the value of V_TRIP above ΔV_TH and compares V_IN 109 directly to V_TRIP. To do so, the gate of NMOS 314 is configured to receive V_REF 112B from the mux 204 and resistor divider 112. As a result, the value of V_TRIP increases by the value of V_REF 112B. In the examples described herein, V_REF 112B is approximately 300 mV. In other examples, the controller circuitry 202 selects a different voltage to be the value of V_REF 112B.

Because the resistor divider 112 is a system level component, it may be designed and manufactured separately and/or independently from the load protector circuitry 114. As a result, the quantities and magnitudes of reference voltages available to the load protector circuitry 114 can be considered system level parameters that are not adjustable by the controller circuitry 202. Advantageously, the example controller circuitry 202 can make small adjustments to the value of V_TRIP, and thereby avoid the need for a local resistor divider, using current mirrors.

Within the POR circuitry 206, the PMOS connector circuitry 320 and the PMOS 322 collectively form a first current mirror, and the PMOSs 324 and 326 collectively form a second current mirror. The two current mirrors increase the overall gain of the POR circuitry 206 by folding out the current from the core comparator (which includes NMOSs 314 and 316, PMOS 304, and connector circuitry 320), while supporting low headroom operation. Furthermore, the control circuitry 202 can adjust the gain of one or more of the current mirrors to change the value of V_TRIP. Similarly, the NMOS connector circuitry 330 connects both the first current mirror and NMOS 328. Such a structure results in the number of transistors in the PMOS connector circuitry 320 and NMOS connector circuitry 330 influencing the value of V_TRIP. The value of V_TRIP in FIG. 3 is given as:

$$V\_\mathrm{TRIP}=V\_\mathrm{REF}112B+\Delta V\_\mathrm{TH}+m(V\_T)\ln\left[(AB)(\beta\_\mathrm{NAT})/(\beta\_\mathrm{SVT})\right] \quad \text{(Eq. 1)}$$

In equation 1, m refers to a non-ideality factor (which, in some examples, has a value between 1 and 2), V_T refers to thermal voltage, A refers to the number of parallel transistors in PMOS connector circuitry 320, B refers to the number of parallel transistors in NMOS connector circuitry 330, β_SVT refers to the transconductance parameter of the SVT NMOS 316, and β_NAT refers to the transconductance parameter of the NAT NMOS 314. In equation 1, thermal voltage is given by the expression V_T=kT/q (where k refers to Boltzmann's constant, T refers to the temperate in Kelvin and q refers to the charge of an electron). In some examples, V_T is approximately 26 milli-Volts at room temperature.

The controller circuitry 202 can change the value of V_REF 112B by providing a select signal to the mux 204. The controller circuitry 202 can also change the value of both A and B by providing configuration signals to the PMOS connector circuitry 320 and NMOS connector circuitry 330 as discussed further in connection with FIG. 4. Furthermore, the term m(V_T)ln [(AB)(β_SVT)/(β_NAT)] is smaller in magnitude than V_REF 112B. As a result, the controller circuitry 202 can make coarse adjustments to the value of V_TRIP by selecting a different reference voltage to be V_REF 112B and can make fine adjustments to V_TRIP by changing the values of A or B. Such precise configurability of V_TRIP allows the example load protector circuitry 114 to support different requirements of the load while being implemented using less space than other POR circuits. In some examples, V_REF 112B may be referred to as a selected reference voltage because it is selected by the controller circuitry 202 to contribute to the value of V_TRIP.

Generally, a NAT MOS device is referred to as "natural" or "native" because the channel region of the transistor is not doped (and therefore has a negative intrinsic threshold voltage). Furthermore, an SVT MOS device is referred to as "standard" because doping the channel region of the transistor to achieve an intrinsic threshold voltage of approximately 700 mV is one of the most common MOS doping procedures throughout the IC industry. Because NAT and SVT MOSs require no channel doping and a widely used channel doping procedure, respectively, both types of transistors are comparatively inexpensive to implement. In contrast, LVT MOS devices are comparatively expensive to implement because achieving the low intrinsic threshold voltage requires the use of a non-standard channel doping procedure. Advantageously, the example POR circuitry 206 uses SVT or NAT MOS transistors while omitting the use of other transistors, and therefore can be implemented at less cost than other POR circuits that rely on LVT transistors rather than a local resistor divider.

Figure 4:
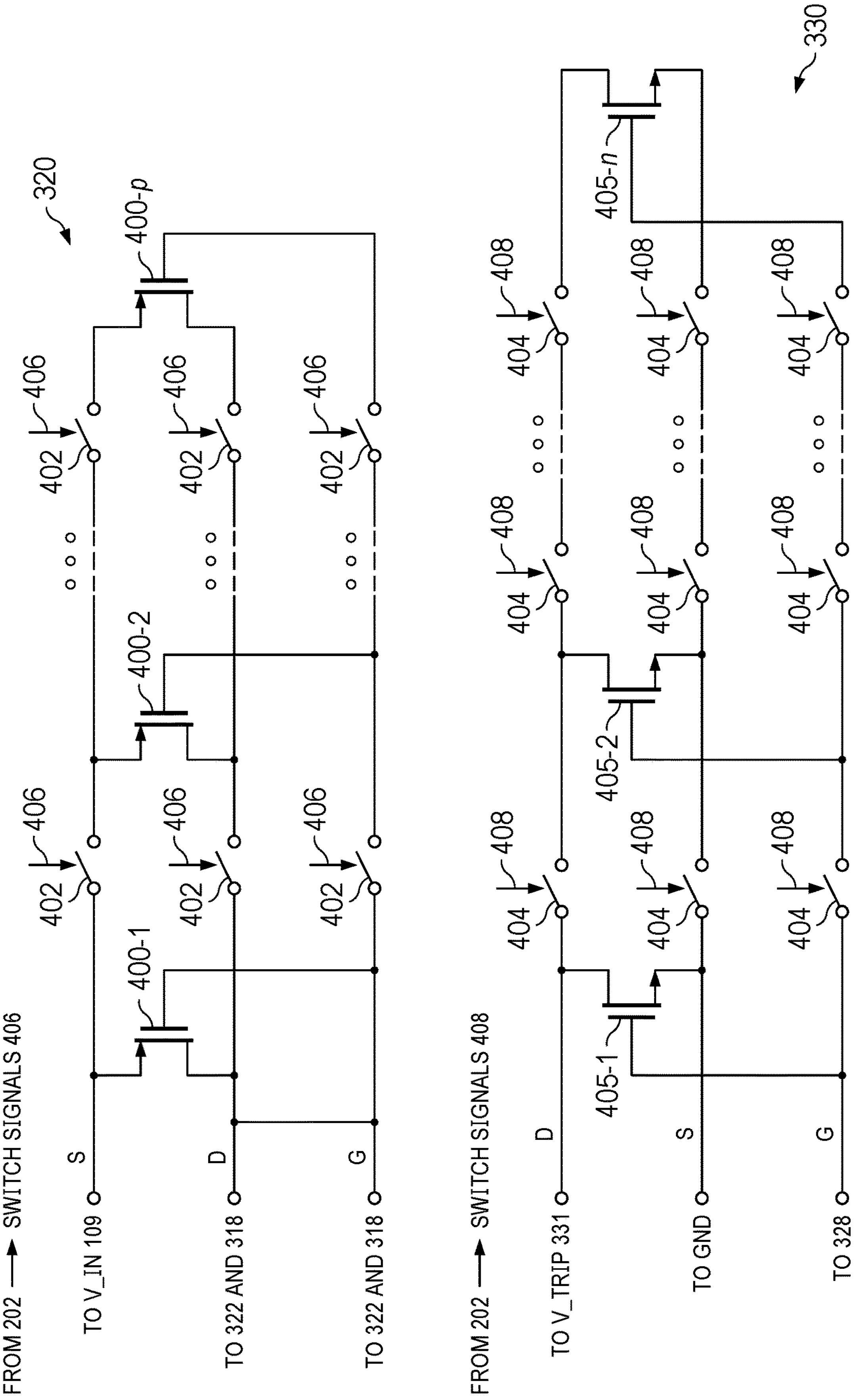
FIG. 4 is a schematic diagram of example implementations of the PMOS connector circuitry and the NMOS connector circuitry of FIG. 3.

FIG. 4 is a schematic diagram of example implementations of the PMOS connector circuitry 320 and the NMOS connector circuitry 330 of FIG. 3. In FIG. 4, the example PMOS connector circuitry 320 includes example PMOS transistors 400-1, 400-2, . . . , **400-*p* (which may be collectively referred to as PMOSs 400), example switches 402, and example switch signals 406. FIG. 4 also includes the NMOS connector circuitry 330, which includes example NMOS transistors 405-1, 405-2, . . . , 405-*n* (which may be collectively referred to as NMOSs 405), example switches 404, and example switch signals 408**.

Within the PMOS connector circuitry 320, the PMOSs 400 include source terminals configured to receive V_IN 109, drain terminals configured to be coupled to PMOS 322 and NMOS 318, and gate terminals configured to be coupled to PMOS 322 and NMOS 318. In the example of FIG. 4, the switches 402 are coupled to the PMOSs 400 in-between the respective source, drain, and gate terminals such that one or more of the PMOSs 400 may couple to one another in parallel depending on which of the switches 402 are in a closed state.

The controller circuitry 202 transmits the switch signals 406 to set the open/close status of the switches 402 and connect a particular number of the PMOSs 400 to one another. For example, if the controller circuitry 202 determines A=2 to achieve a desired value of V_TRIP as discussed above, the controller circuitry 202 may transmit the switch signals 406 such that the switches 402 between PMOS 400-1 and PMOS 400-2 are closed, while the remaining switches 402 are open. In such an example, PMOS 400-1 and PMOS 400-2 connect to each other in parallel and to the rest of the POR circuitry 206 while PMOS 400-3, . . . , PMOS **400-*p* are disconnected. More generally, the controller circuitry 202 may use the switch signals 406 to connect A of the PMOSs 400 to one another in parallel, where A is any integer less than or equal to p (the total number of PMOSs 400** in the circuit).

Within the NMOS connector circuitry 330, the NMOSs 405-1 to **405-*n* include drain terminals configured to connect to the comparison terminal 331, source terminals configured to be coupled to grand, and gate terminals configured to be coupled to NMOS 328. In the example of FIG. 4, the switches 404 are coupled to the NMOSs 405-1 to 405-*n* in-between the respective source, drain, and gate terminals such that one or more of the NMOSs 405-1 to 405-*n* may couple to one another in parallel depending on which of the switches 404** are in a closed state.

The controller circuitry 202 transmits the switch signals 408 to set the open/close status of the switches 404 and connect a particular number of the NMOSs 405-1 to **405-*n* to one another. For example, if the controller circuitry 202 determines B=2 to achieve a desired value of V_TRIP as discussed above, the controller circuitry 202 may transmit the switch signals 408 such that the switches 404 between NMOS 405-1 and NMOS 405-2 are closed, while the remaining switches 404 are open. In such an example, NMOS 405-1 and NMOS 405-2 connect to each other in parallel and to the rest of the POR circuitry 206 while NMOS 405-3, . . . , NMOS 405-*n* are disconnected. More generally, the controller circuitry 202 may use the switch signals 408 to connect B of the NMOSs 405-1 to 405-*n* to one another in parallel, where B is any integer less than or equal to n (the total number of NMOSs 405-1 to 405-*n*** in the circuit).

In examples described herein, the load protector circuitry 114 is implemented in an environment where the value of V_TRIP may change over time. Accordingly, the example of FIG. 4 includes switches 402 and 404 within the PMOS connector circuitry 320 and NMOS circuitry 330 that are set by the controller circuitry 202 to programmatically adjust the value of V_TRIP. In other examples, the load protector circuitry 114 is implemented in an application where the value of V_TRIP does not change. In such examples, the PMOS connector circuitry 320 and/or NMOS connector circuitry 330 may be hardcoded to include a specific number of transistors in parallel. Such a direct connection may remove the ability for the value of V_TRIP to change, but also remove the need to include the controller circuitry 202 or switches 402 and 404 (thereby reducing cost and/or area of the IC area dedicated to the load protector circuitry 114).

Figure 5:
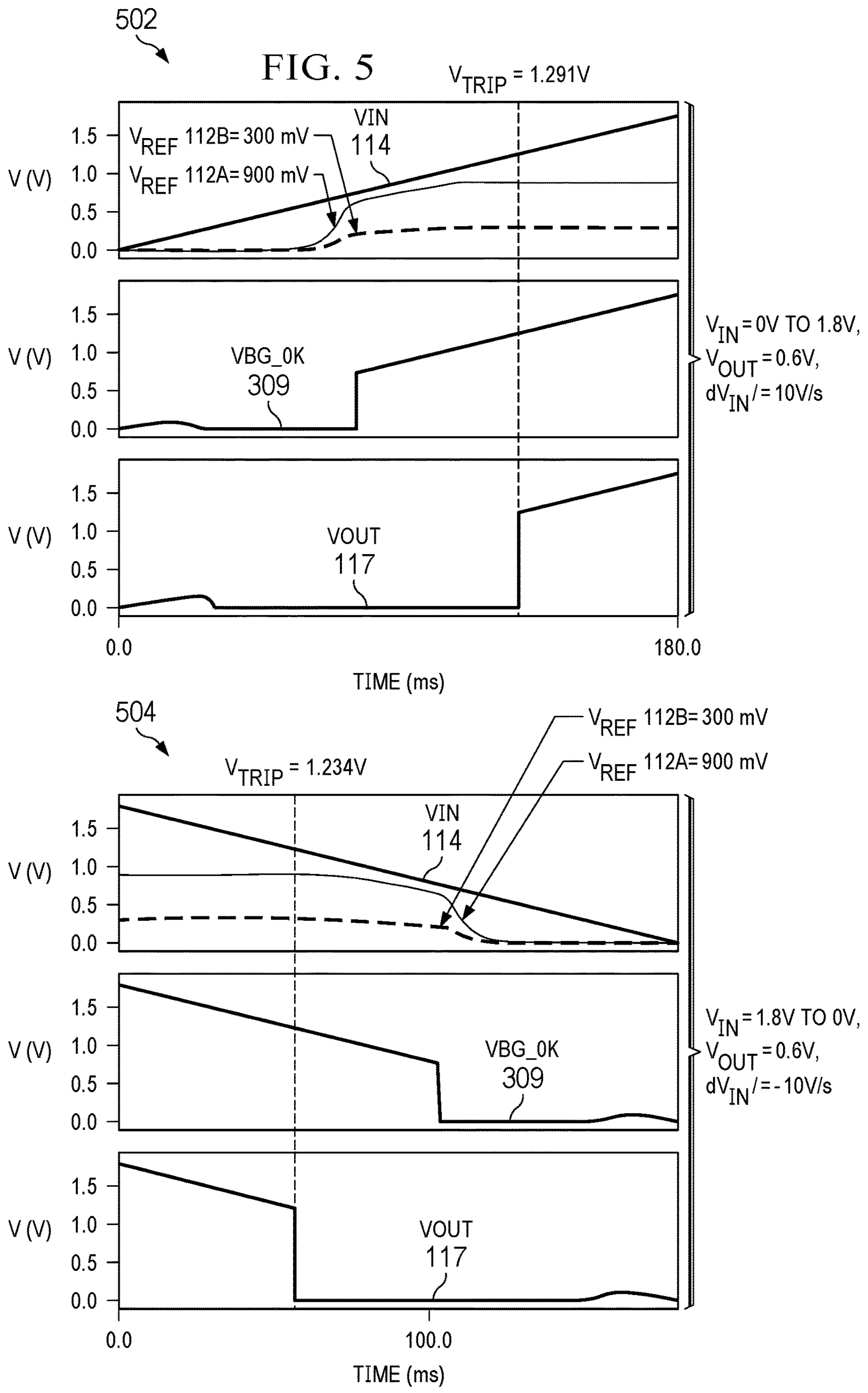
FIG. 5 are first and second graphs illustrating example operations performed by the POR circuitry of FIG. 2.

FIG. 5 are first and second graphs illustrating example operations performed by the POR circuitry of FIG. 2. FIG. 5 includes example graphs 502 and 504. The graphs 502 and 504 both show the value of V_IN 104, V_BG_OK 309, and V_OUT 117 over time.

In addition to the value of V_TRIP, the value of V_OUT 117 also depends on the value of V_IN 109 and the noise inherent within said input signal. If unaccounted for, variations within the value of V_IN 109 may cause the POR circuitry 206 to trip (e.g., the value of the enable signal 115 to change, thereby disconnecting and reconnecting the voltage regulator circuitry 116 to the load 118) multiple times around V_TRIP, thereby decreasing the performance of the load protector circuitry 114. Such error may be referred to herein as jitter.

Advantageously, the POR circuitry 206 includes the hysteresis circuitry 334 as shown in FIG. 3 to protect against jitter within V_IN 109. The hysteresis circuitry 334 forms a feedback loop such that the voltage at which V_OUT 117 begins to match V_IN 109 (e.g., a rising V_TRIP threshold) is different than the voltage at which V_OUT 117 stops matching V_IN 109 and falls back to 0 V (e.g., a falling V_TRIP threshold). Generally, a designer or manufacturer of the POR circuitry 206 may seek a difference between the rising V_TRIP threshold and falling V_TRIP threshold within the range of approximately 50 mV-100 mV to protect against jitter within V_IN 109.

The graph 502 shows an empirical example of how the values of V_BG_OK 309 and V_OUT 117 change as V_IN 104 increases from 0.0 V to +1.8 V. Using values of V_REF 112A=900 mV and V_REF 112B=300 mV, V_OUT 117 begins to match the value of V_IN 109 at approximately 1.291 V.

The graph 504 shows an empirical example of how the values of V_BG_OK 309 and V_OUT 117 change as V_IN 104 decreases from +1.8 V to 0.0 V. Using values of V_REF 112A=900 mV and V_REF 112B=300 mV, V_OUT 117 stops matching the value of V_IN 109 and falls back to 0 V at approximately 1.234 V. Accordingly, FIG. 5 shows that the example hysteresis circuitry 334 successfully protects against jitter within V_IN 109 by implementing a difference between the rising V_TRIP threshold and the falling V_TRIP threshold of approximately 57 mV.

Figure 6:
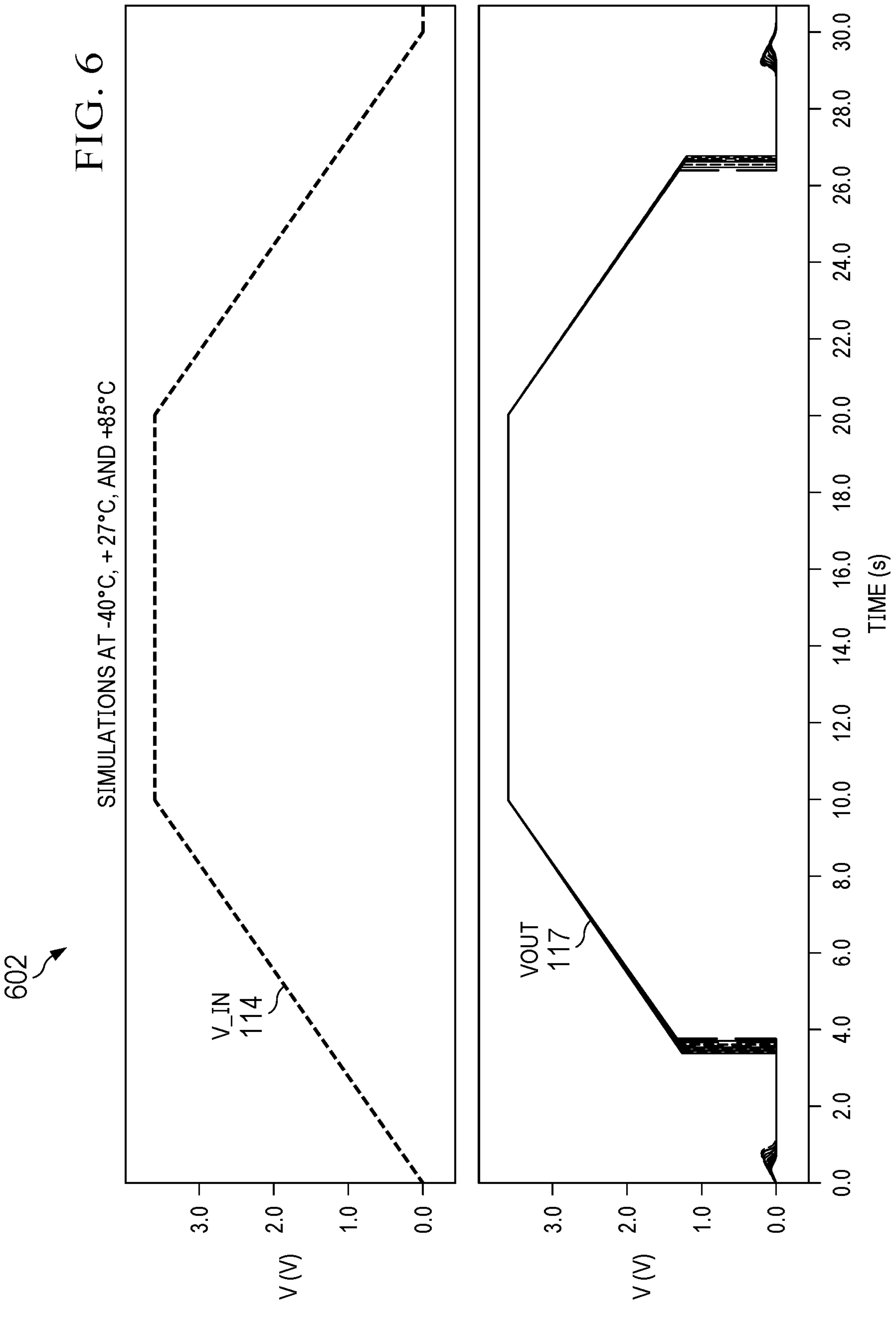
FIG. 6 is a third graph illustrating example operations performed by the POR circuitry of FIG. 2.

FIG. 6 is a third graph illustrating example operations performed by the POR circuitry of FIG. 2. The example graph 602 includes a first signal representing the value of V_IN 114 over time and multiple signals representing the value of V_OUT 117 over time. The example of FIG. 6 describes multiple simulations in which the POR circuitry 206 performs operations at −40° C., +27° C., and +85° C. Throughout the various simulations, the value of V_IN 114 increases linearly from 0.0V to approximately +3.6V, stays at approximately +3.6V for a period of time, and then decreases linearly back to 0.0V.

The value of V_OUT 117 changes between simulations due to the variations in temperature affecting the performance of electrical components. In the example of FIG. 6, the difference between the rising V_TRIP threshold and falling V_TRIP threshold has a standard deviation of approximately 20 mV and an accuracy of approximately 94 to 95%. Accordingly, the example POR circuitry 206 remains accurate throughout a variety of environmental conditions and therefore supports a variety of applications.

Figure 7:
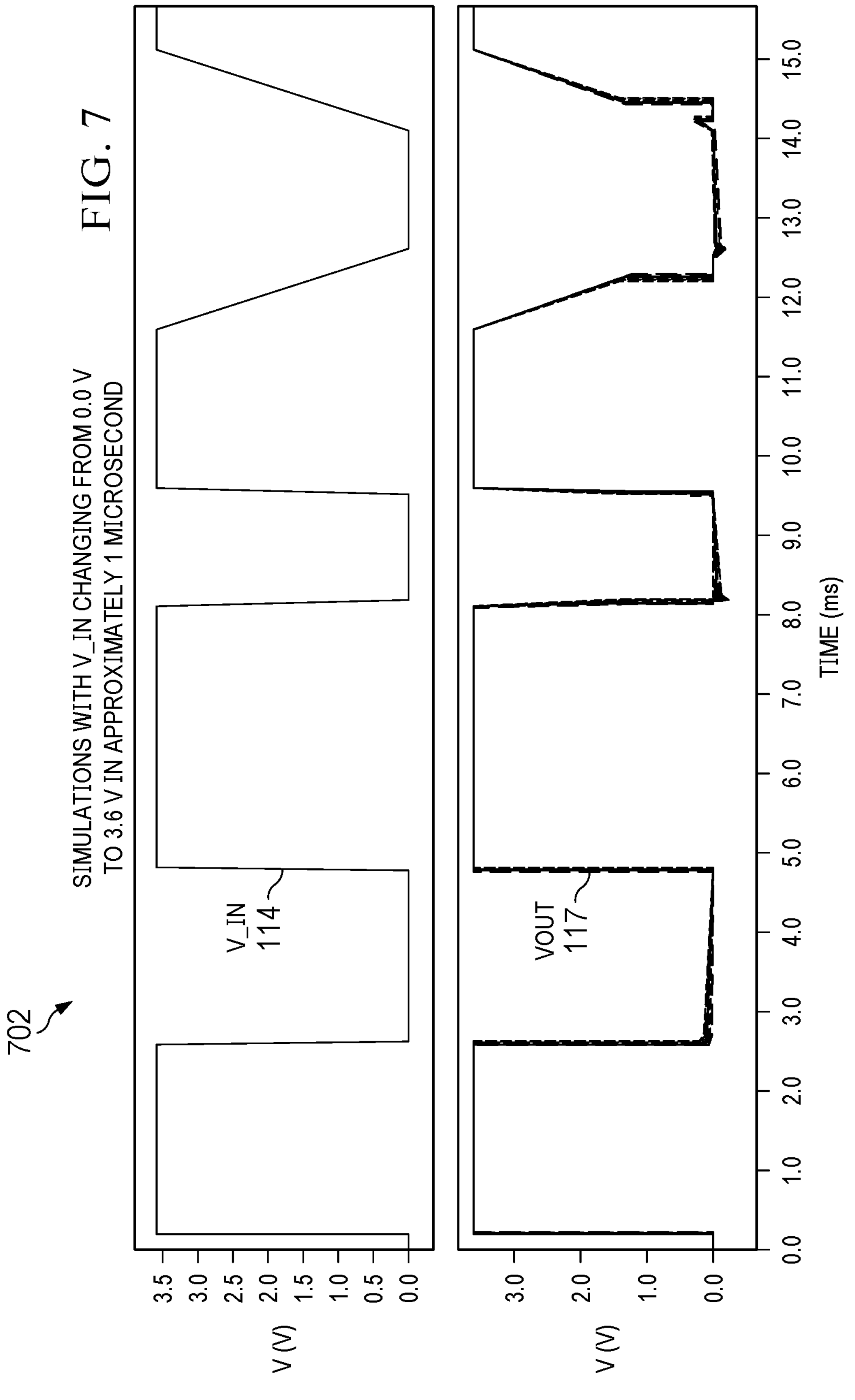
FIG. 7 is a fourth graph illustrating example operations performed by the POR circuitry of FIG. 2.

FIG. 7 is a fourth graph illustrating example operations performed by the POR circuitry of FIG. 2. The example graph 702 includes a first signal representing the value of V_IN 114 over time and multiple signals representing the value of V_OUT 117 over time. The example of FIG. 7 describes multiple simulations in which the POR circuitry 206 performs operations in response to various changes of the value of V_IN 109.

In addition to accuracy, speed is another performance metric of the POR circuitry 206. In FIGS. 5 and 6, the value of V_IN 104 changes relatively slowly (e.g., taking approximately 360 milliseconds in FIG. 5 and 10.0 s in FIG. 6 to transition from 0.0 V to approximately +3.6 V). In FIG. 7, the value of V_IN 104 changes (compared to FIGS. 5 and 6) relatively quickly (e.g., taking as little as 1 microsecond to transition from 0.0V to +3.6V) to represent high speed applications that require POR circuits. The example signals representing V_OUT 117 in FIG. 7 show that the example POR circuitry 206 described herein responds to the relatively high-speed changes to V_IN 109 with high accuracy, thereby supporting a variety of applications.

Figure 8:
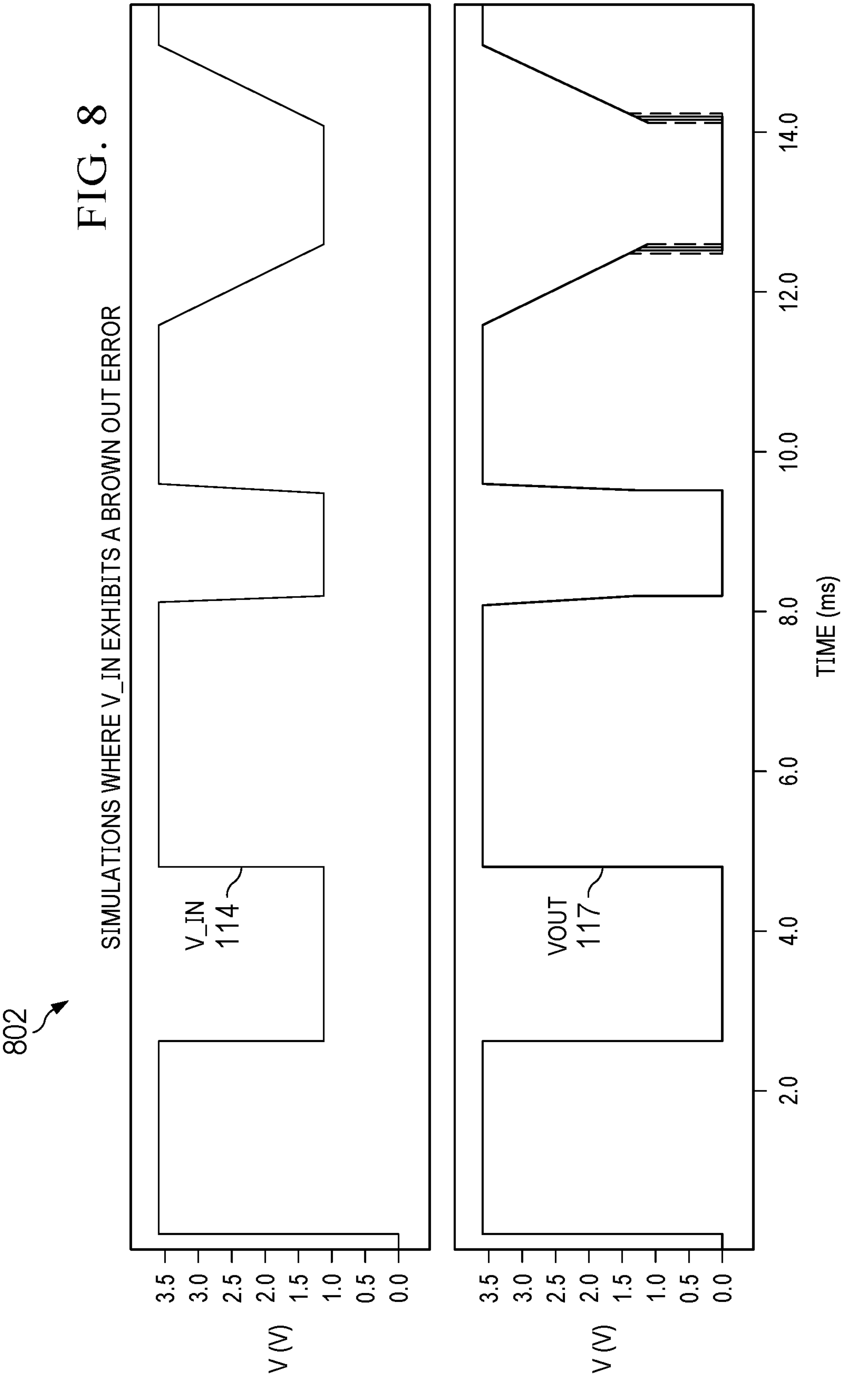
FIG. 8 is a fifth graph illustrating example operations performed by the POR circuitry of FIG. 2.

FIG. 8 is a fifth graph illustrating example operations performed by the POR circuitry of FIG. 2. The example graph 802 includes a first signal representing the value of V_IN 114 over time and multiple signals representing the value of V_OUT 117 over time. The example of FIG. 8 describes multiple simulations in which the POR circuitry 206 performs operations where an error prevents the value of V_IN 114 from falling below approximately +1.1 V (slightly below the V_TRIP value of approximately +1.2 V) instead of falling to 0.0 V. In some examples, such an error is referred to as a brown out.

The example signals representing V_OUT 117 in FIG. 8 show that the example POR circuitry 206 successfully changes the value of the enable signal 115 such that the voltage regulator circuitry 116 starts and stops providing power to the load 118 at V_TRIP=1.2 V, even when V_IN 109 inadvertently remains at a value near V_TRIP for an extended period of time. Accordingly, FIG. 8 shows how the POR circuitry 206 can prevent a previous error (e.g., within the AC power supply circuitry 104, DC power supply circuitry 106, and/or buck regulator circuitry 108) from being passed to the load 118 as an incorrect amount of power.

Figure 9:
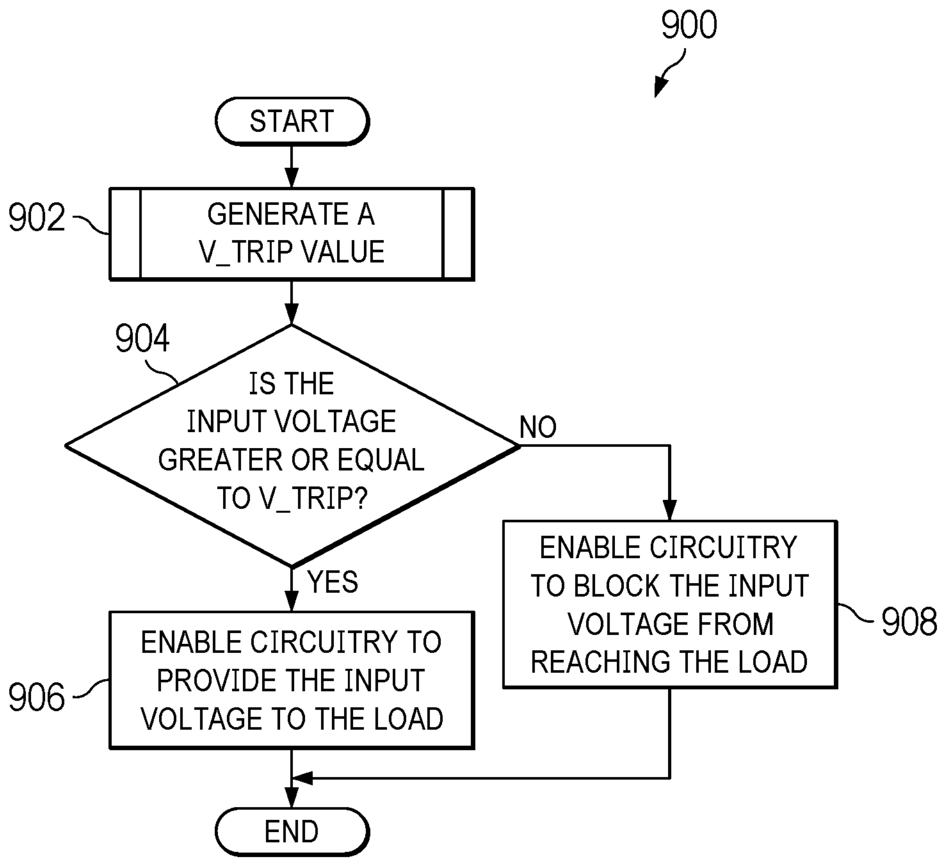
FIG. 9 is a flowchart representative of example machine-readable instructions and/or example operations that may be executed, instantiated, and/or performed using an example programmable circuitry implementation of the voltage protector circuitry of FIG. 1.

FIG. 9 is a flowchart representative of example machine-readable instructions and/or example operations 900 that may be executed, instantiated, and/or performed by programmable circuitry to protect the load 118. The example machine-readable instructions and/or the example operations 900 of FIG. 9 begin when the POR circuitry 206 generates a V_TRIP value. (Block 902). The value of V_TRIP is determined by the controller circuitry 202 based on the requirements of the load 118. In some examples, the value of V_TRIP may change over time. Block 902 is discussed further in connection with FIG. 10.

The POR circuitry 206 determines whether the input voltage (V_IN 109) is greater or equal to the V_TRIP value. (Block 904). The comparison occurs by connecting the input of the hysteresis circuitry 334 to the drains of PMOS 322 and NMOS connector circuitry 330.

If the input voltage is greater or equal to the V_TRIP value (Block 904: Yes), the POR circuitry 206 enables circuitry (e.g., the voltage regulator circuitry 116) to provide the input voltage to the load. (Block 906). In doing so, the load 118 receives an amount of power and can safely perform operations. The example machine-readable instructions and/or the example operations 900 end after block 906.

Alternatively, if the input voltage is less than the V_TRIP value (Block 904: No), the POR circuitry 206 enables circuitry (e.g., the voltage regulator circuitry 116) to block the input voltage from reaching the load. (Block 908). In doing so, the load protector circuitry 114 prevents the load 118 from inadvertently attempting to perform operations with V_IN 109 before it is safe to use. The example machine-readable instructions and/or the example operations 900 end after block 908.

Figure 10:
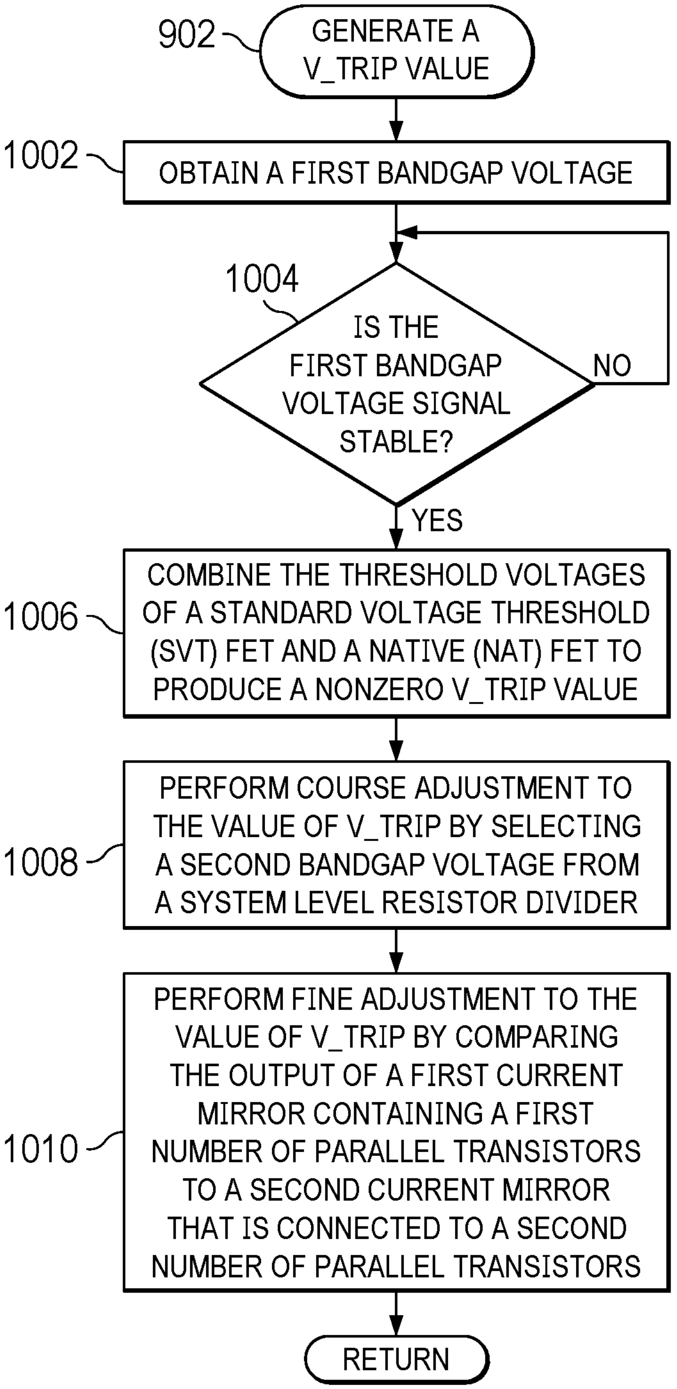
FIG. 10 is a flowchart representative of example machine-readable instructions and/or example operations that may be executed, instantiated, and/or performed using example programmable circuitry to generate a V_TRIP value as described in FIG. 9.

FIG. 10 is a flowchart representative of example machine-readable instructions and/or example operations that may be executed, instantiated, and/or performed using example programmable circuitry to generate a V_TRIP value as described in FIG. 9. In particular, the flowchart of FIG. 10 describes an example implementation of block 902 of FIG. 9.

Execution of block 902 begins when the example POR circuitry 206 receives a first bandgap voltage. (Block 1002). In the example of FIG. 3, the first bandgap voltage is labelled as V_REF 112A and is received at the gate terminals of NMOSs 312 and 318.

The POR circuitry 206 determines whether the first bandgap voltage signal is stable. (Block 1004). In the example of FIG. 3, the NMOS 304, resistor 306, inverter 308, NMOS 310, and NMOS 312 collectively function as BG_OK circuitry and implement block 1004 by comparing the first bandgap reference voltage (e.g., V_REF 112A) against the threshold voltage of NMOS 312. If the first reference voltage is higher than the threshold voltage of NMOS 312, then the voltage at the input of inverter 308 decreases. Such a change in voltage signals that the bandgap voltage is stable by tripping inverter 308, making the value of V_BG_OK 309 increase.

The foregoing components of the POR circuitry 206 continuously check the stability of the voltage stable. Accordingly, if the first bandgap voltage signal is not yet stable (Block 1004: No), the POR circuitry 206 continues to implement block 1004.

Once the first bandgap voltage is stable (Block 1004: Yes), the POR circuitry 206 combines the threshold voltages of an SVT FET and a NAT FET to produce a nonzero V_TRIP value. (Block 1006). In examples described above, the SVT FET of block 1006 is NMOS 316 and the NAT FET is NMOS 314. Furthermore, the nonzero voltage added to the value of V_TRIP at block 1006 is referred to above as ΔV_TH. The POR circuitry 206 produces ΔV_TH by subtracting the gate to source voltage (V_GS) of the SVT and NAT NMOS devices. Since both transistors operate in the subthreshold region, the V_GS is given by the following expression:

$$V\_GS(\text{subthreshold}) = V\_\text{TH} + m(V\_T)\ln\left[(I\_D/\beta\right] \quad \text{(Eq. 2)}$$

In equation 2, V_TH is the threshold voltage of the transistor and I_D is the drain current of the transistor. Since V_IN 109 is applied to the gate of SVT NMOS 316, V_REF 112B is applied to the gate of NAT NMOS 314, and the source terminals of the two transistors are connected together, the difference between the two gate voltages is calculated as follows using equation 2:

$$V\_GS(\text{SVT}) - V\_GS(\text{NAT}) = V\_\text{TH}(\text{SVT}) - V\_\text{TH}(\text{NAT}) + m(V\_T)\ln\left[AB(\beta\_\text{NAT})/(\beta\_\text{SVT})\right] \quad \text{(Eq. 3)}$$

Substituting ΔV_TH for V_TH(SVT)−V_TH(NAT) in Equation 3 results in the expression for V_TRIP in Equation 1.

The load protector circuitry 114 performs coarse adjustment to the value of V_TRIP by selecting a second bandgap voltage from a system-level resistor divider. (Block 1008). In the examples described above, the second bandgap voltage of block 1008 is V_REF 112B and the system-level resistor divider is the resistor divider 112. To select V_REF 112B, the controller circuitry 202 provides a select signal to the mux 204 such that one of n possible reference voltages produced by the resistor divider 112 is provided to the gate terminal of the NAT NMOS 314. As a result of the selection, the value of V_TRIP increases by V_REF 112B.

The load protector circuitry 114 performs fine adjustment to the value of V_TRIP by comparing the output of a first current mirror containing a first number of parallel transistors to a second current mirror that is connected to a second number of parallel transistors. (Block 1010). In the examples described above, the PMOS connector circuitry 320 and the PMOS 322 collectively form a first current mirror, and the PMOSs 324 and 326 collectively form a second current mirror. By sending the switch signals 406 and 408 to the PMOS connector circuitry 320 and the NMOS connector circuitry 330 respectively, the controller circuitry 202 causes A of the transistors within PMOS connector circuitry 320 to connect to one another in parallel and causes B of the transistors within NMOS connector circuitry 330 to connect to one another in parallel. As a result, the value of V_TRIP increases by m(V_T)ln [(AB)(β_NAT)/(β_SVT)] as described above. The adjustment of block 1010 is referred to as fine because the magnitude of m(V_T)ln [(AB)(β_NAT)/(β_SVT)] is less than the magnitude of V_REF 112B. As a result, the total value of V_TRIP is V_REF 112B+ΔV_TH+m(V_T)ln [(AB)(β_NAT)/(β_SVT)] and the load protector circuitry 114 can use the enable signal 115 to precisely determine when the voltage regulator circuitry 116 will provide V_IN 109 to the load 118. The example machine-readable instructions and/or operations 900 return to block 904 after block 1010.

Figure 11:
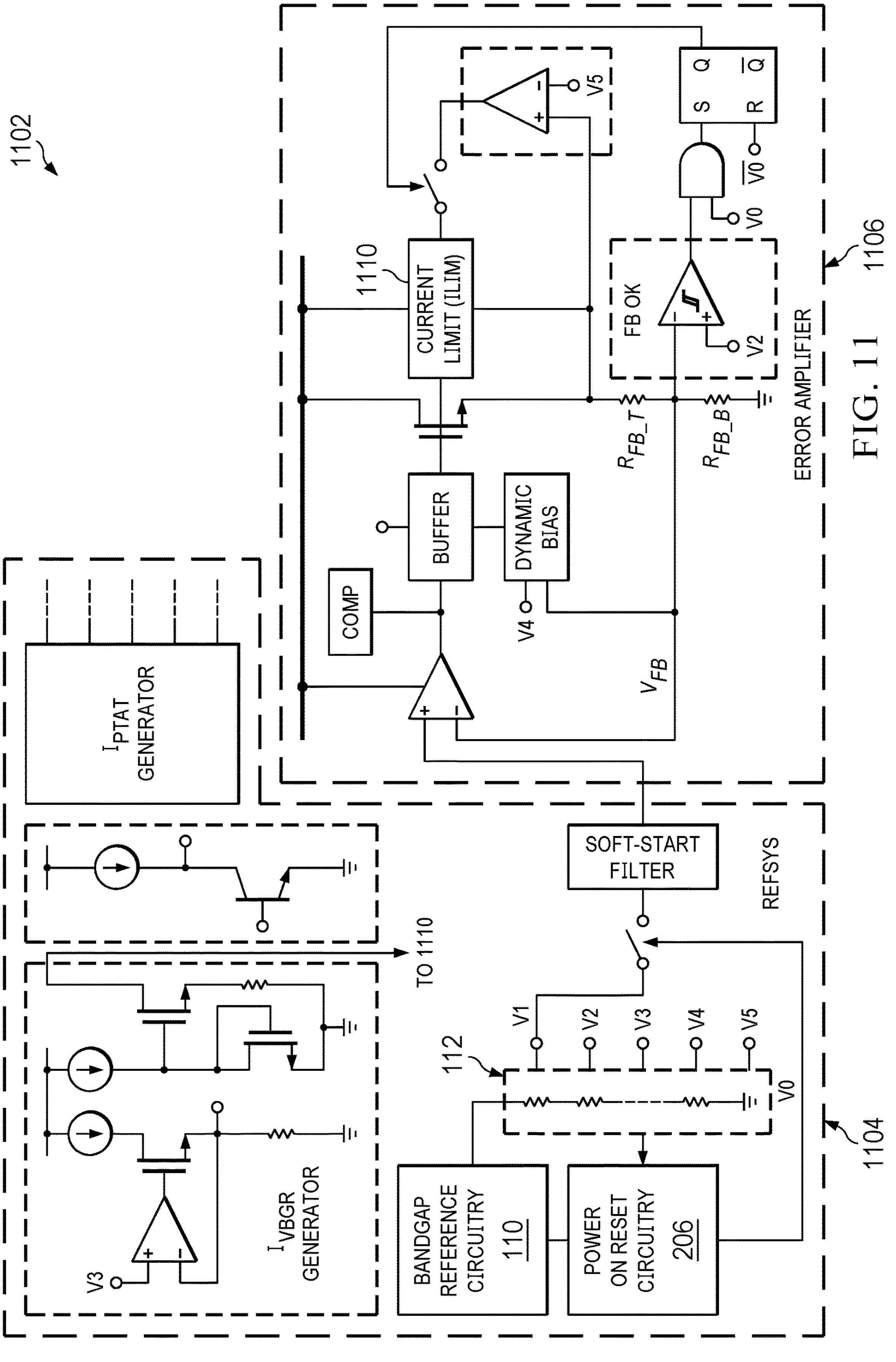
FIG. 11 is a block diagram of an example implementation of a system-on-a-chip (SOC) that implements one or more components of FIGS. 1 and 2.

FIG. 11 is a block diagram of an example implementation of a system-on-a-chip (SOC) that implements one or more components of FIGS. 1 and 2. The example SoC 1102 of FIG. 11 includes system-level circuitry 1104 and error amplifier circuitry 1106. The system-level circuitry 1104 includes the BGR circuitry 110, the resistor divider 112, and the POR circuitry 20 of FIGS. 1 and 2. The error amplifier circuitry 1106 includes current limiter circuitry 1110.

The SoC 1102 is an example implementation of a linear and low-dropout (LDO) regulator. LDO regulators generally produce a regulated output voltage using a higher input voltage. The foregoing LDO regulation functionality is provided in FIG. 11 by the error amplifier circuitry 1106.

FIG. 11 shows that the error amplifier circuitry 1106 uses several reference voltages (e.g., V2, V4, and V5) from the resistor divider 112 as inputs. Accordingly, the POR circuitry 206 within the system-level circuitry 1104 prevents the error amplifier circuitry 1106 from performing LDO regulation until the values of V2, V4, and V5 have risen to safe and operable levels. To do so, the POR circuitry 206 produces an output that opens or closes a switch, thereby enabling or disabling soft-start filter circuitry and subsequently causing the error amplifier circuitry 1106 to perform operations. The output of the POR circuitry 206 is labelled V0 in FIG. 11 and is referred to as the enable signal 115 above. The error amplifier circuitry 1106 is an example implementation of the voltage regulator circuitry 116 of FIG. 1 because it uses the enable signal 115 (e.g., V0) to determine when it is safe to provide an input voltage to a load.

More generally, a SOC performing any type of operations may use reference voltages from a system-level resistor divider as inputs and may rely on POR circuitry to verify the stability of the reference voltages before performing operations (as shown in FIG. 11 and described herein). As such, a designer or manufacturer of POR circuitry cannot configure a system-level resistor divider to produce a specific reference voltage (e.g., one of V1-V5 in FIG. 11) because one or more of the reference voltages are already being used to perform operations by the primary components of the system (e.g., V2, V4, and V5 are used within the error amplifier circuitry 1106, and the current limiter circuitry 1110 is dependent on V3).

Advantageously, the example POR circuitry 206 described herein is configured to use one of the pre-determined reference voltages as V_REF 112B to increase the value of V_TRIP, and further adjust the value of V_TRIP based on the A PMOS transistors connected in parallel and the B NMOS transistors connected in parallel. As such, the POR circuitry 206 can perform POR specific operations using a system level resistor divider that was independently designed and manufactured, thereby reducing the size and cost of the POR circuitry 206.

In the example of FIG. 11, the value of V_TRIP does not change, so the SoC 1102 does not include the controller circuitry 202 or mux 204. Rather, the POR circuitry 206 has a direct electrical connection to a particular terminal of the resistor divider 112 and includes particular numbers of PMOS and NMOS transistors in parallel as described above.

Figure 12:
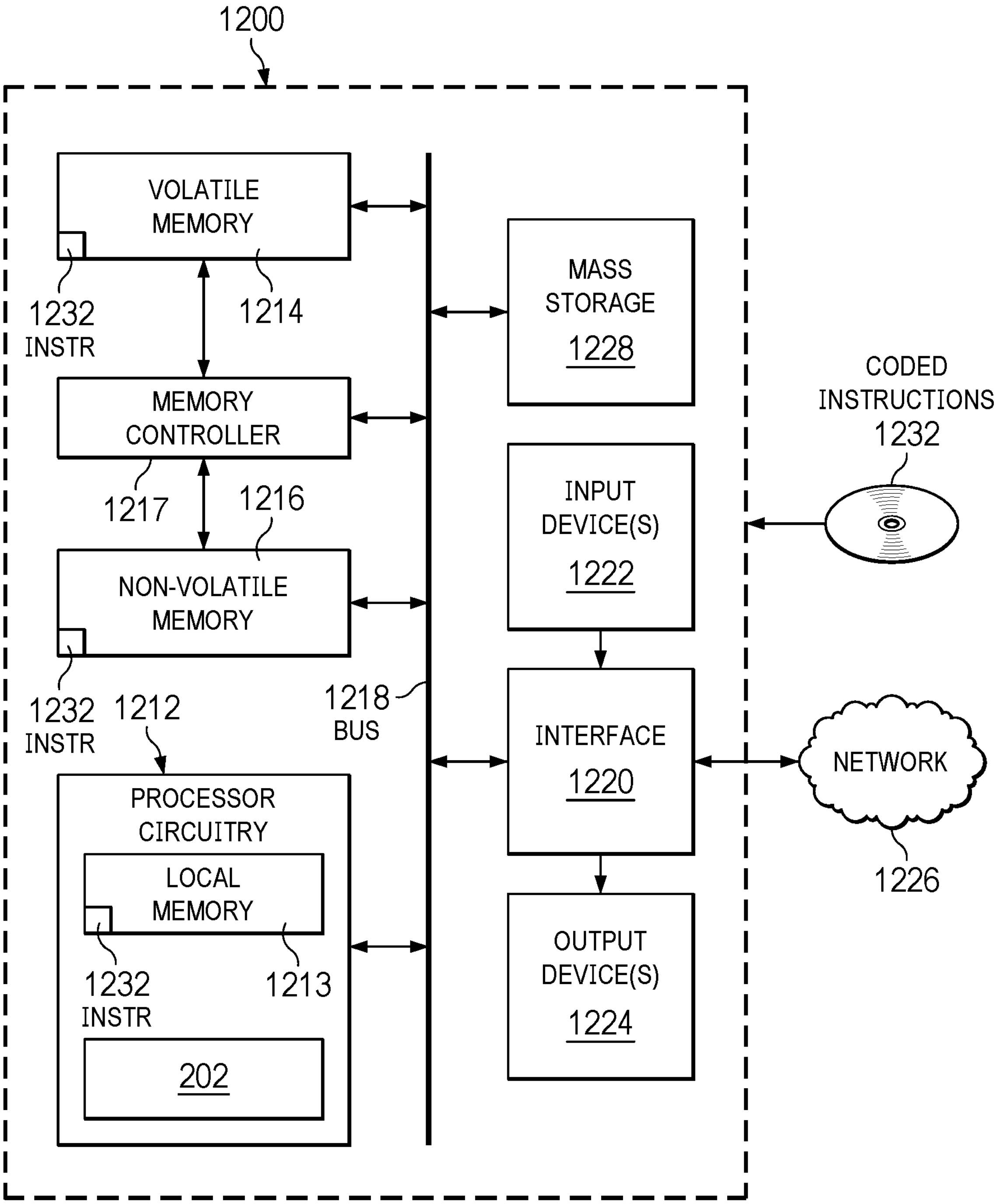
FIG. 12 is a block diagram of an example processing platform including programmable circuitry structured to execute, instantiate, and/or perform the example machine-readable instructions and/or perform the example operations of FIGS. 9 and 10 to implement the load protector circuitry 114 of FIGS. 2 and 3.

FIG. 12 is a block diagram of an example programmable circuitry platform 1200 structured to execute and/or instantiate the example machine-readable instructions and/or the example operations of FIGS. 9 and 10 to implement the load protector circuitry 114 of FIGS. 2 and 3. The programmable circuitry platform 1200 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing and/or electronic device.

The programmable circuitry platform 1200 of the illustrated example includes programmable circuitry 1212. The programmable circuitry 1212 of the illustrated example is hardware. For example, the programmable circuitry 1212 can be implemented by one or more integrated circuits, logic circuits, FPGAs, microprocessors, CPUs, GPUs, DSPs, and/or microcontrollers from any desired family or manufacturer. The programmable circuitry 1212 may be implemented by one or more semiconductor based (e.g., silicon based) devices. In this example, the programmable circuitry 1212 implements the controller circuitry 202.

The programmable circuitry 1212 of the illustrated example includes a local memory 1213 (e.g., a cache, registers, etc.). The programmable circuitry 1212 of the illustrated example is in communication with main memory 1214, 1216, which includes a volatile memory 1214 and a non-volatile memory 1216, by a bus 1218. The volatile memory 1214 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1216 may be implemented by flash memory and/or any other desired type of memory device. Access to the main memory 1214, 1216 of the illustrated example is controlled by a memory controller 1217. In some examples, the memory controller 1217 may be implemented by one or more integrated circuits, logic circuits, microcontrollers from any desired family or manufacturer, or any other type of circuitry to manage the flow of data going to and from the main memory 1214, 1216.

The programmable circuitry platform 1200 of the illustrated example also includes interface circuitry 1220. The interface circuitry 1220 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 1222 are connected to the interface circuitry 1220. The input device(s) 1222 permit(s) a user (e.g., a human user, a machine user, etc.) to enter data and/or commands into the programmable circuitry 1212. The input device(s) 1222 can be implemented by, for example, an audio sensor, a microphone, a camera (still or video), a keyboard, a button, a mouse, a touchscreen, a trackpad, a trackball, an isopoint device, and/or a voice recognition system.

One or more output devices 1224 are also connected to the interface circuitry 1220 of the illustrated example. The output device(s) 1224 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1220 of the illustrated example, thus, typically includes a graphics driver card, a graphics driver chip, and/or graphics processor circuitry such as a GPU.

The interface circuitry 1220 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1226. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc.

The programmable circuitry platform 1200 of the illustrated example also includes one or more mass storage discs or devices 1228 to store firmware, software, and/or data. Examples of such mass storage discs or devices 1228 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs.

The machine-readable instructions 1232, which may be implemented by the machine-readable instructions of FIGS.

9 and 10, may be stored in the mass storage device 1228, in the volatile memory 1214, in the non-volatile memory 1216, and/or on at least one non-transitory computer readable storage medium such as a CD or DVD which may be removable.

While an example manner of implementing the load protector circuitry 114 of FIG. 1 is illustrated in FIGS. 2 and 3, one or more of the elements, processes, and/or devices illustrated in FIGS. 2 and 3 may be combined, divided, re-arranged, omitted, eliminated, and/or implemented in any other way. Further, the controller circuitry 202, the mux 204, the NMOSs 304, 310, 312, 314, 316, and 318, the NMOS connector circuitry 330, the PMOSs 322, 324, 326, 332, and 333, the PMOS connector circuitry 320, the resistors 306 and 317, the inverters 308, 336, and 338, the hysteresis circuitry 334, and/or, more generally, the example load protector circuitry 114 and the POR circuitry 206 of FIGS. 2 and 3, may be implemented by hardware alone or by hardware in combination with software and/or firmware. Thus, for example, any of the controller circuitry 202, the mux 204, the NMOSs 304, 310, 312, 314, 316, and 318, the NMOS connector circuitry 330, the PMOSs 322, 324, 326, 332, and 333, the PMOS connector circuitry 320, the resistors 306 and 317, the inverters 308, 336, and 338, the hysteresis circuitry 334, and/or, more generally, the example load protector circuitry 114 and the POR circuitry 206 of FIGS. 2 and 3, could be implemented by programmable circuitry in combination with machine-readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), and/or field programmable logic device(s) (FPLD(s)) such as FPGAs. Further still, the example load protector circuitry 114 of FIGS. 2 and 3 may include one or more elements, processes, and/or devices in addition to, or instead of, those illustrated in FIGS. 2 and 3, and/or may include more than one of any or all of the illustrated elements, processes and devices.

Flowchart(s) representative of example machine-readable instructions, which may be executed by programmable circuitry to implement and/or instantiate the load protector circuitry 114 of FIGS. 2 and 3 and/or representative of example operations which may be performed by programmable circuitry to implement and/or instantiate the load protector circuitry 114 of FIGS. 2 and 3, are shown in FIGS. 9 and 10. The machine-readable instructions may be one or more executable programs or portion(s) of one or more executable programs for execution by programmable circuitry such as the programmable circuitry 1212 shown in the example programmable circuitry platform 1200 discussed below in connection with FIG. 12 and/or may be one or more function(s) or portion(s) of functions to be performed by the example programmable circuitry (e.g., an FPGA). In some examples, the machine-readable instructions cause an operation, a task, etc., to be carried out and/or performed in an automated manner in the real world. As used herein, "automated" means without human involvement.

The program may be embodied in instructions (e.g., software and/or firmware) stored on one or more non-transitory computer readable and/or machine-readable storage medium such as cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EEPROM), flash memory, etc.), volatile memory (e.g., Random Access Memory (RAM) of any type, etc.), and/or any other storage device or storage disk. The instructions of the non-transitory computer readable and/or machine-readable medium may program and/or be executed by programmable circuitry located in one or more hardware devices, but the entire program and/or parts thereof could alternatively be executed and/or instantiated by one or more hardware devices other than the programmable circuitry and/or embodied in dedicated hardware. The machine-readable instructions may be distributed across multiple hardware devices and/or executed by two or more hardware devices (e.g., a server and a client hardware device). For example, the client hardware device may be implemented by an endpoint client hardware device (e.g., a hardware device associated with a human and/or machine user) or an intermediate client hardware device gateway (e.g., a radio access network (RAN)) that may facilitate communication between a server and an endpoint client hardware device. Similarly, the non-transitory computer readable storage medium may include one or more mediums. Further, although the example program is described with reference to the flowchart(s) illustrated in FIGS. 9 and 10, many other methods of implementing the example load protector circuitry 114 may alternatively be used. For example, the order of execution of the blocks of the flowchart(s) may be changed, and/or some of the blocks described may be changed, eliminated, or combined. Any or all of the blocks of the flow chart may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The programmable circuitry may be distributed in different network locations and/or local to one or more hardware devices (e.g., a single-core processor (e.g., a single core CPU), a multi-core processor (e.g., a multi-core CPU, an XPU, etc.)). For example, the programmable circuitry may be a CPU and/or an FPGA located in the same package (e.g., the same integrated circuit (IC) package or in two or more separate housings), one or more processors in a single machine, multiple processors distributed across multiple servers of a server rack, multiple processors distributed across one or more server racks, etc., and/or any combination(s) thereof.

The machine-readable instructions described herein may be stored in one or more of a compressed format, an encrypted format, a fragmented format, a compiled format, an executable format, a packaged format, etc. Machine-readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to create, manufacture, and/or produce machine executable instructions. For example, the machine-readable instructions may be fragmented and stored on one or more storage devices, disks and/or computing devices (e.g., servers) located at the same or different locations of a network or collection of networks (e.g., in the cloud, in edge devices, etc.). The machine-readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or another machine. For example, the machine-readable instructions may be stored in multiple parts, which are individually compressed, encrypted, and/or stored on separate computing devices, wherein the parts when decrypted, decompressed, and/or combined form a set of computer-executable and/or machine executable instructions that implement one or more functions and/or operations that may together form a program such as that described herein.

In another example, the machine-readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine-readable instructions may need to be configured (e.g., settings stored, data input, network addresses recorded, etc.) before the machine-readable instructions and/or the corresponding program(s) can be executed in whole or in part. Thus, machine-readable, computer-readable and/or machine-readable media, as used herein, may include instructions and/or program(s) regardless of the particular format or state of the machine-readable instructions and/or program(s).

The machine-readable instructions described herein can be represented by any past, present, or future instruction language, scripting language, programming language, etc. For example, the machine-readable instructions may be represented using any of the following languages: C, C++, Java, Csharp, Perl, Python, JavaScript, HyperText Markup Language (HTML), Structured Query Language (SQL), Swift, etc.

As mentioned above, the example operations of FIGS. 9 and 10 may be implemented using executable instructions (e.g., computer readable and/or machine-readable instructions) stored on one or more non-transitory computer readable and/or machine-readable media. As used herein, the terms non-transitory computer readable medium, non-transitory computer readable storage medium, non-transitory machine-readable medium, and/or non-transitory machine-readable storage medium are expressly defined to include any type of computer readable storage device and/or storage disk and to exclude propagating signals and to exclude transmission media. Examples of such non-transitory computer readable medium, non-transitory computer readable storage medium, non-transitory machine-readable medium, and/or non-transitory machine-readable storage medium include optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms "non-transitory computer readable storage device" and "non-transitory machine-readable storage device" are defined to include any physical (mechanical, magnetic and/or electrical) hardware to retain information for a time period, but to exclude propagating signals and to exclude transmission media. Examples of non-transitory computer readable storage devices and/or non-transitory machine-readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine-readable instructions, etc., and/or manufactured to execute computer-readable instructions, machine-readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" refers to implementations including any of (1) at least one A, (2) at least one B, or (3) at least one A and at least one B. Similarly, as used herein in the context of describing structures, components, items, objects and/or things, the phrase "at least one of A or B" refers to implementations including any of (1) at least one A, (2) at least one B, or (3) at least one A and at least one B. As used herein in the context of describing the performance or execution of processes, instructions, actions, activities, etc., the phrase "at least one of A and B" refers to implementations including any of (1) at least one A, (2) at least one B, or (3) at least one A and at least one B. Similarly, as used herein in the context of describing the performance or execution of processes, instructions, actions, activities, etc., the phrase "at least one of A or B" refers to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is not feasible and/or advantageous.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real-world imperfections. For example, "approximately" and "about" may indicate such dimensions may be within a tolerance range of +/−10% unless otherwise specified herein.

As used herein "substantially real time" refers to occurrence in a near instantaneous manner recognizing there may be real world delays for computing time, transmission, etc. Thus, unless otherwise specified, "substantially real time" refers to real time+1 second.

As used herein, the phrase "in communication," including variations thereof, encompasses direct communication and/or indirect communication through one or more intermediary components, and does not require direct physical (e.g., wired) communication and/or constant communication, but rather also includes selective communication at periodic intervals, scheduled intervals, aperiodic intervals, and/or one-time events.

As used herein, "programmable circuitry" is defined to include (i) one or more special purpose electrical circuits (e.g., an application specific circuit (ASIC)) structured to perform specific operation(s) and including one or more semiconductor-based logic devices (e.g., electrical hardware implemented by one or more transistors), and/or (ii) one or more general purpose semiconductor-based electrical circuits programmable with instructions to perform specific functions(s) and/or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations and/or functions, Field Programmable Gate Arrays (FPGAs) that may be programmed with second instructions to configure and/or structure the FPGAs to instantiate one or more operations and/or functions corresponding to the first instructions, Graphics Processor Units (GPUs) that may execute first instructions to perform one or more operations and/or functions, Digital Signal Processors (DSPs) that may execute first instructions to perform one or more operations and/or functions, XPUs, Network Processing Units (NPUs) one or more microcontrollers that may execute first instructions to perform one or more operations and/or functions and/or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and/or any combination (s) thereof), and orchestration technology (e.g., application programming interface(s) (API(s)) that may assign computing task(s) to whichever one(s) of the multiple types of programmable circuitry is/are suited and available to perform the computing task(s).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

Modifications are possible in the described embodiments, and other embodiments are possible, within the scope of the claims.

From the foregoing, it will be appreciated that example systems, apparatus, articles of manufacture, and methods have described load protector circuitry that quickly and accurately enables circuitry to provide a voltage to a load when the value of said voltage is in a safe range, and that can be implemented with less size and cost than other POR circuits. The example POR circuitry described herein determines when to enable circuitry to provide the voltage to the load based on a trip voltage that can be programmatically changed with both coarse and fine adjustments. The example POR circuitry performs operations using an input from a system level resistor divider rather than a local, POR-specific resistor divider, thereby saving size and cost. The example POR circuitry can be implemented without transistors that require complex masking (e.g., LVT FETs), instead including an SVT FET, a NAT FET, and other common PMOS and NMOS architectures, which also saves size and cost. Described systems, apparatus, articles of manufacture, and methods are accordingly directed to one or more improvement(s) in the operation of a machine such as a computer or other electronic and/or mechanical device.

What is claimed is:

1. An apparatus comprising:
- circuitry having a first reference input, a second reference input, a voltage input, and an enable output, the circuitry configurable to:
  - receive a first voltage at the first reference input;
  - receive a second voltage at the second reference input;
  - receive a third voltage at the voltage input;
  - responsive to the first voltage being below a first threshold voltage, set the enable output to a first state;
  - responsive to the third voltage being above a second threshold voltage based on the second voltage, set the enable output to a second state.

2. The apparatus of claim 1, wherein the circuitry includes:
- a comparator having a first input, a second input, an enable input, and an output, the first input coupled to the voltage input, the second input coupled to the second input of the circuitry, and the output of the comparator coupled to the output of the circuitry; and
- enable circuitry having an input coupled to the first input of the circuitry and an output coupled to the enable input of the comparator.

3. The apparatus of claim 2, wherein the comparator includes: :
- a first transistor having a control terminal coupled to the first input of the comparator, the first transistor being a native (NAT) field effect transistor (FET); and
- a second transistor having a control terminal coupled to the second input of the comparator, the second transistor being a standard voltage threshold (SVT) FET.

4. The apparatus of claim 1, further comprising a resistor divider coupled to the first and second reference inputs.

5. The apparatus of claim 2, wherein the output of the comparator is a first output, and the comparator has a second output, and the circuitry includes:
- a first current mirror having an input coupled to the first output of the comparator;
- a second current mirror having an input coupled to the second output of the comparator; and
- wherein the output of the circuitry is coupled to outputs of the first and second current mirror.

6. The apparatus of claim 1, wherein at least one of the first or second current mirrors includes a number of parallel transistors coupled to the first or second outputs of the comparator via switches.

7. The apparatus of claim 1, wherein the second threshold voltage is adjustable via the switches.

8. The apparatus of claim 1, further comprising a voltage regulator circuit having an enable input coupled to the enable output of the circuitry.

9. An apparatus comprising:
- a resistor divider having outputs;
- first circuitry having a first reference input, a second reference input, a first voltage input, and an enable output, the first and second reference inputs coupled to the outputs of the resistor divider, the circuitry configurable to:
  - receive a first voltage at the first reference input;
  - receive a second voltage at the second reference input;
  - receive a third voltage at the first voltage input;
  - responsive to the first voltage being below a first threshold voltage, set the enable output to a first state;
  - responsive to the third voltage being above a second threshold voltage based on the second voltage, set the enable output to a second state; and
- second circuitry having a second voltage input coupled to the first voltage input, an enable input coupled to the enable output, and an output, the second circuitry configurable to provide a fourth voltage at its output responsive to the third volage and the enable input having the second state, and provide a fifth voltage at its output responsive to the enable input having the first state.

10. The apparatus of claim 9, further comprising a load coupled to the output of the second circuitry.

11. The apparatus of claim 9, wherein:
- the apparatus further includes bandgap reference circuitry coupled to an input of the resistor divider.

12. The apparatus of claim 9, wherein the first circuitry includes:
- a comparator having a first input, a second input, an enable input, and an output, the first input coupled to the first voltage input, the second input coupled to the second input of the circuitry, and the output of the comparator coupled to the output of the circuitry, the comparator including a NAT FET coupled to the first input and a SVT FET coupled to the second input; and
- enable circuitry having an input coupled to the first input of the circuitry and an output coupled to the enable input of the comparator.

13. The apparatus of claim 12, wherein the output of the comparator is a first output, and the comparator has a second output, and the first circuitry includes:
- a first current mirror having an input coupled to the first output of the comparator;
- a second current mirror having an input coupled to the second output of the comparator; and
- wherein the output of the circuitry is coupled to outputs of the first and second current mirror.

14. The apparatus of claim 13, wherein at least one of the first or second current mirrors includes a number of parallel transistors coupled to the first or second outputs of the comparator via switches.

15. The apparatus of claim 14, wherein the second threshold voltage is adjustable via the switches.

16. The apparatus of claim 9, wherein the second circuitry includes voltage regulator circuitry.

17. An apparatus comprising:

programmable circuitry configurable to cause a resistor divider to provide a first voltage and a second voltage;

first circuitry having a first reference input, a second reference input, a first voltage input, and an enable output, the first and second reference inputs coupled to the outputs of the resistor divider, the first circuitry configurable to:

receive a first voltage at the first reference input;

receive a second voltage at the second reference input;

receive a third voltage at the first voltage input;

responsive to the first voltage being below a first threshold voltage, set the enable output to a first state;

responsive to the third voltage being above a second threshold voltage based on the second voltage, set the enable output to a second state; and second circuitry having a second voltage input coupled to the first voltage input, an enable input coupled to the enable output, and an output, the second circuitry configurable to provide a fourth voltage at its output responsive to the third volage and the enable input having the second state, and provide a fifth voltage at its output responsive to the enable input having the first state.

18. The apparatus of claim 17, wherein the first circuitry includes:

a comparator having a first input, a second input, an enable input, and an output, the first input coupled to the voltage input, the second input coupled to the second input of the circuitry, and the output of the comparator coupled to the output of the circuitry; and enable circuitry having an input coupled to the first input of the circuitry and an output coupled to the enable input of the comparator.

19. The apparatus of claim 18, wherein the comparator includes NAT FET coupled to the first input and a SVT FET coupled to the second input.

* * * * *